United States Patent
Haran et al.

(10) Patent No.: US 8,358,012 B2
(45) Date of Patent: Jan. 22, 2013

(54) METAL SEMICONDUCTOR ALLOY STRUCTURE FOR LOW CONTACT RESISTANCE

(75) Inventors: Balasubramanian S. Haran, Watervliet, NY (US); Sivananda K. Kanakasabapathy, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 112 days.

(21) Appl. No.: 12/849,390

(22) Filed: Aug. 3, 2010

(65) Prior Publication Data
US 2012/0032275 A1  Feb. 9, 2012

(51) Int. Cl.
*H01L 29/40* (2006.01)
(52) U.S. Cl. ........ 257/774; 257/382; 257/384; 257/623; 257/E29.116; 257/E29.119
(58) Field of Classification Search .......... 257/382, 257/383, 384, 385, 618, 622, 623, 774, E29.116, 257/E29.119, E29.121
See application file for complete search history.

(56) References Cited

U.S. PATENT DOCUMENTS

| | | | |
|---|---|---|---|
| 6,593,217 B1* | 7/2003 | Fujisawa | 438/495 |
| 7,102,201 B2* | 9/2006 | Furukawa et al. | 257/382 |
| 7,649,232 B2* | 1/2010 | Tamura et al. | 257/383 |
| 2008/0023772 A1* | 1/2008 | Kawakita | 257/369 |
| 2008/0237712 A1* | 10/2008 | Wei et al. | 257/347 |
| 2011/0133259 A1* | 6/2011 | Fischer et al. | 257/288 |
| 2011/0201165 A1* | 8/2011 | Hoentschel et al. | 438/229 |

\* cited by examiner

*Primary Examiner* — Eduardo A Rodela
(74) *Attorney, Agent, or Firm* — Scully, Scott, Murphy & Presser, P.C.; Louis J. Percello, Esq.

(57) ABSTRACT

Contact via holes are etched in a dielectric material layer overlying a semiconductor layer to expose the topmost surface of the semiconductor layer. The contact via holes are extended into the semiconductor material layer by continuing to etch the semiconductor layer so that a trench having semiconductor sidewalls is formed in the semiconductor material layer. A metal layer is deposited over the dielectric material layer and the sidewalls and bottom surface of the trench. Upon an anneal at an elevated temperature, a metal semiconductor alloy region is formed, which includes a top metal semiconductor alloy portion that includes a cavity therein and a bottom metal semiconductor alloy portion that underlies the cavity and including a horizontal portion. A metal contact via is formed within the cavity so that the top metal semiconductor alloy portion laterally surrounds a bottom portion of a bottom portion of the metal contact via.

19 Claims, 21 Drawing Sheets

METAL SEMICONDUCTOR ALLOY STRUCTURE FOR LOW CONTACT RESISTANCE

BACKGROUND

The present disclosure relates to metal semiconductor alloy structures for providing low contact resistance and methods of forming the same.

Metal semiconductor alloys such as metal silicides, metal germanides, metal germano-silicides reduce contact resistance between a metal structure such as a metal contact via structure and a semiconductor region such as a source region, a drain region, and a gate conductor line. Formation of metal semiconductor alloys requires an interdiffusion between a metal and a semiconductor material. Typically, the metal is provided as a metal layer, which is deposited after deposition of a dielectric material layer overlying a semiconductor layer and formation of holes within the dielectric material layer to expose the semiconductor material on the top surface of the semiconductor layer. The interface between the metal layer and the underlying semiconductor material is subjected to an anneal at an elevated temperature, typically from 400 degrees Celsius to 700 degrees Celsius, to effect the interdiffusion of the metal and the semiconductor material.

The interdiffusion of the metal and the semiconductor material is self-limiting at a given anneal temperature. Thus, the volume of the metal semiconductor alloy formed by the anneal is limited by the area of the contact between the metal layer and the underlying semiconductor material. As the dimensions of semiconductor devices scale down, the total area available for forming a metal semiconductor alloy per contact is reduced in proportion to the square of the rate of scaling for a linear dimension because the area of contact is scaled in two dimensions. Thus, the contact resistance of a metal semiconductor alloy region between a metal contact via and an underlying semiconductor region becomes significant with the scaling of semiconductor devices. In other words, the reduction in the available area per contact limits the volume of a metal semiconductor alloy region that can be formed, and thereby raises the contact resistance of the metal semiconductor alloy region with the scaling down of device dimensions. However, a high contact resistance of a metal semiconductor alloy region adversely impacts device performance by introducing extra parasitic resistance.

BRIEF SUMMARY

Contact via holes are etched in a dielectric material layer overlying a semiconductor layer to expose the topmost surface of the semiconductor layer. The contact via holes are extended into the semiconductor material layer by continuing to etch the semiconductor layer so that a trench having semiconductor sidewalls is formed in the semiconductor material layer. A metal layer is deposited over the dielectric material layer and the sidewalls and bottom surface of the trench. Upon an anneal at an elevated temperature, a metal semiconductor alloy region is formed, which includes a top metal semiconductor alloy portion that includes a cavity therein and a bottom metal semiconductor alloy portion that underlies the cavity and including a horizontal portion. A metal contact via is formed within the cavity so that the top metal semiconductor alloy portion laterally surrounds a bottom portion of a bottom portion of the metal contact via.

According to an aspect of the present disclosure, a semiconductor structure includes: a trench located in a semiconductor material region in a semiconductor substrate; a metal semiconductor alloy region located within the trench; and a contact via structure including a lower contact via portion that is located within the metal semiconductor alloy region and laterally and vertically spaced from the semiconductor material region by the metal semiconductor alloy region.

According to another aspect of the present disclosure, a method of forming a semiconductor structure includes: forming at least one dielectric material layer over a semiconductor structure including a semiconductor material region; forming a trench that extends from a top surface of the at least one dielectric material layer into the semiconductor material portion; and forming a metal semiconductor alloy region by diffusing a metal into the semiconductor material region through a sidewall of the trench.

DETAILED DESCRIPTION

Figure 1:
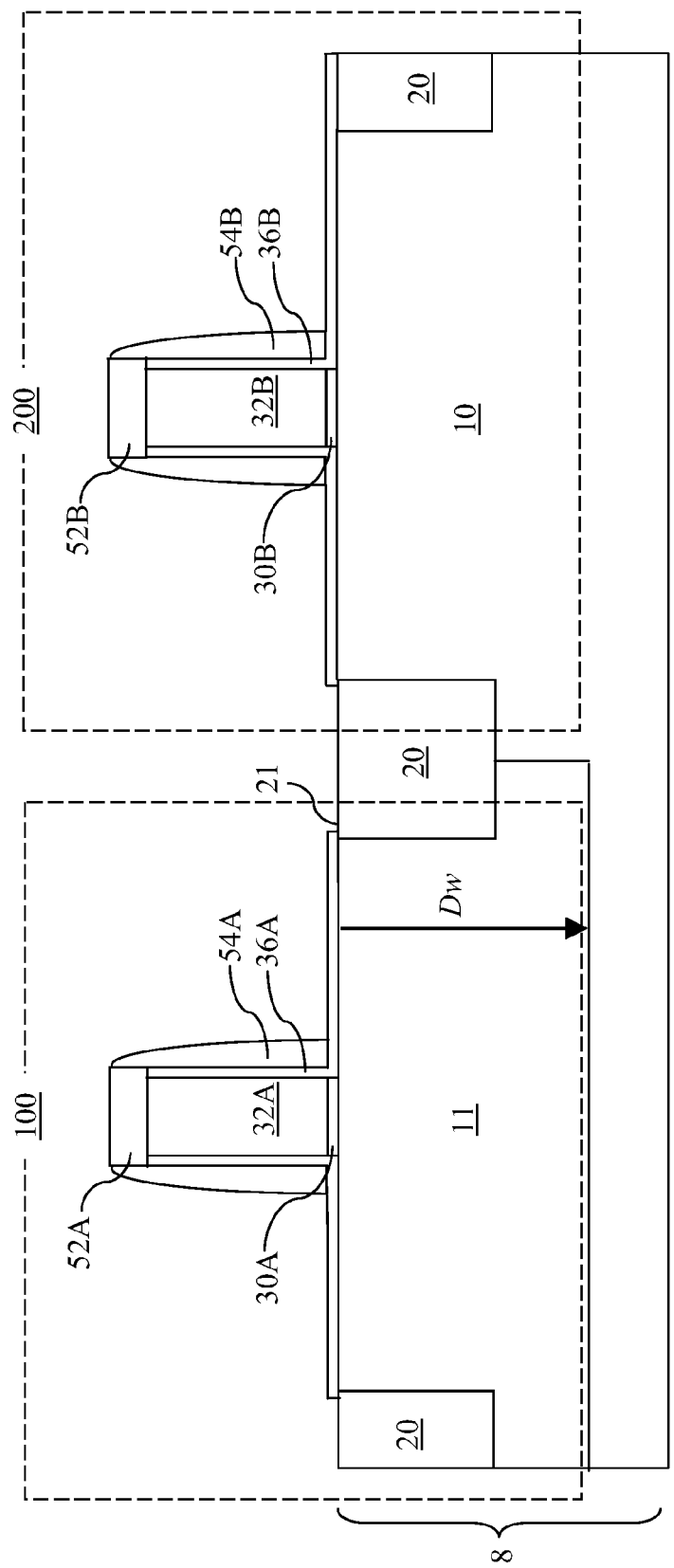
FIG. 1 is a vertical cross-sectional view of an exemplary semiconductor structure after formation of gate stacks on a semiconductor substrate.

As stated above, the present disclosure relates to metal semiconductor alloy structures for providing low contact resistance and methods of forming the same, which are now described in detail with accompanying figures. It is noted that like and corresponding elements are referred to by like reference numerals across the various drawings.

Referring to FIG. 1, an exemplary semiconductor structure according to a first embodiment of the present disclosure is shown, which includes a semiconductor substrate 8 containing a first semiconductor region 10 and a shallow trench isolation structure 20. The semiconductor substrate 8 can be a bulk substrate including a bulk semiconductor material throughout, or a semiconductor-in-insulator (SOI) substrate (not shown) containing a top semiconductor layer, a buried insulator layer located under the top semiconductor layer, and a bottom semiconductor layer located under the buried insulator layer. The semiconductor material of the semiconductor substrate 8 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

The first semiconductor region 10 includes a semiconductor material having a doping of a first conductivity type at a first dopant concentration. The semiconductor substrate 8 further contains a second semiconductor region 11 including the semiconductor material and having a doping of a second conductivity type, wherein the second conductivity type is the opposite of the first conductivity type. The first semiconductor region 10 may have a p-type doping and the second semiconductor region 11 may have an n-type doping, or vice versa. For example, the first semiconductor region 10 can have a p-type doping, and the second semiconductor region 11 can have an n-type doping. In one embodiment, the second semiconductor region 11 includes a well extending from a top surface 21 of the semiconductor substrate 8 to a well depth Dw into the semiconductor substrate 8. Preferably, the first and second semiconductor regions (10, 11) are single crystalline, i.e., have the same crystallographic orientations throughout the volume of the semiconductor substrate 8. In another embodiment, the first semiconductor region 10 and/or the second semiconductor region 11 can be undoped semiconductor regions depending on the type of devices to be built therein. For example, fully depleted semiconductor-on-insulator devices can employ an undoped semiconductor material for the first and/or second semiconductor regions (10, 11) that are bounded by a buried insulator layer at the bottom.

The semiconductor substrate 8 may be a bulk substrate, a semiconductor-on-insulator (SOI) substrate, or a hybrid substrate having a bulk portion and an SOI portion. While the present disclosure is described with a bulk substrate, embodiments employing an SOI substrate or a hybrid substrate are explicitly contemplated herein.

The first semiconductor region 10 and the second semiconductor region 11 can be lightly doped, i.e., have a dopant concentration from $1.0 \times 10^{15}/\text{cm}^3$ to $3.0 \times 10^{18}/\text{cm}^3$, and preferably from $1.0 \times 10^{15}/\text{cm}^3$ to $3.0 \times 10^{17}/\text{cm}^3$, although lesser and greater dopant concentrations are explicitly contemplated herein. Alternately, the first semiconductor region 10 and the second semiconductor region 11 can include intrinsic semiconductor materials.

The exemplary semiconductor structure includes a first device region 100 and a second device region 200, each formed on and containing a portion of the semiconductor substrate 8. The first device region 100 may include a metal-oxide-semiconductor field effect transistor (MOSFET) of one conductivity type, and the second device region 200 may include a MOSFET of the opposite conductivity type. For illustrative purposes, the first device region 100 includes a p-type field effect transistor (PFET), and the second device region 200 may include an n-type field effect transistor (NFET).

The first device region 100 includes a portion of the second semiconductor region 11 and a first gate electrode formed thereupon. Likewise, the second device region 200 includes a portion of the first semiconductor region 10 and a second gate electrode formed thereupon. Each of the first gate electrode and the second gate electrode includes a gate dielectric (30A or 30B) and a gate conductor (32A or 32B), and may be formed by methods well known in the art. The gate dielectrics (30A, 30B) may include a conventional semiconductor oxide based gate dielectric material or a high-k gate dielectric material known in the art. The gate conductor in the first device region 100 is herein referred to as a first gate conductor 32A and the gate conductor in the second device region 200 is herein referred to as a second gate conductor 32B. The gate conductors (32A, 32B) may include a doped semiconductor material such as doped polysilicon or a doped polycrystalline silicon alloy, or may include a metal gate material known in the art. Alternately, a replacement gate integration scheme may be employed, in which a dummy gate stack is formed first, followed by deposition of a gate-level dielectric material layer and planarization thereof, removal of the material of the dummy gate stack, and deposition of a permanent gate dielectric and a permanent gate electrode.

Dielectric gate caps may be formed on top of the first gate electrode and the second gate electrode. The dielectric gate cap in the first device region 100 is herein referred to as a first dielectric gate cap 52A and the dielectric gate cap in the second device region 200 is herein referred to as a second dielectric gate cap 52B.

A first gate spacer 54A is formed on the sidewalls of the first gate conductor 32A, or on the sidewalls of the semiconductor oxide layers (36A, 36B), if present, in the first device region 100. A second gate spacer 54B is formed on the sidewalls of the second gate conductor 32B, or on the sidewalls of the semiconductor oxide layers (36A, 36B), if present, in the second device region 200. Preferably, the first and second gate spacers (54A, 54B) include silicon nitride. The thickness of the first and second gate spacers (54A, 54B) may be adjusted to optimize the offset distance of source/drain extension regions to be subsequently formed from the sidewalls of the first gate electrode and the second gate electrode. The first and second gate spacers (54A, 54B) have a thickness from 3 nm to 30 nm, and typically from 5 nm to 20 nm, although lesser and greater thicknesses are contemplated herein also.

Figure 2:
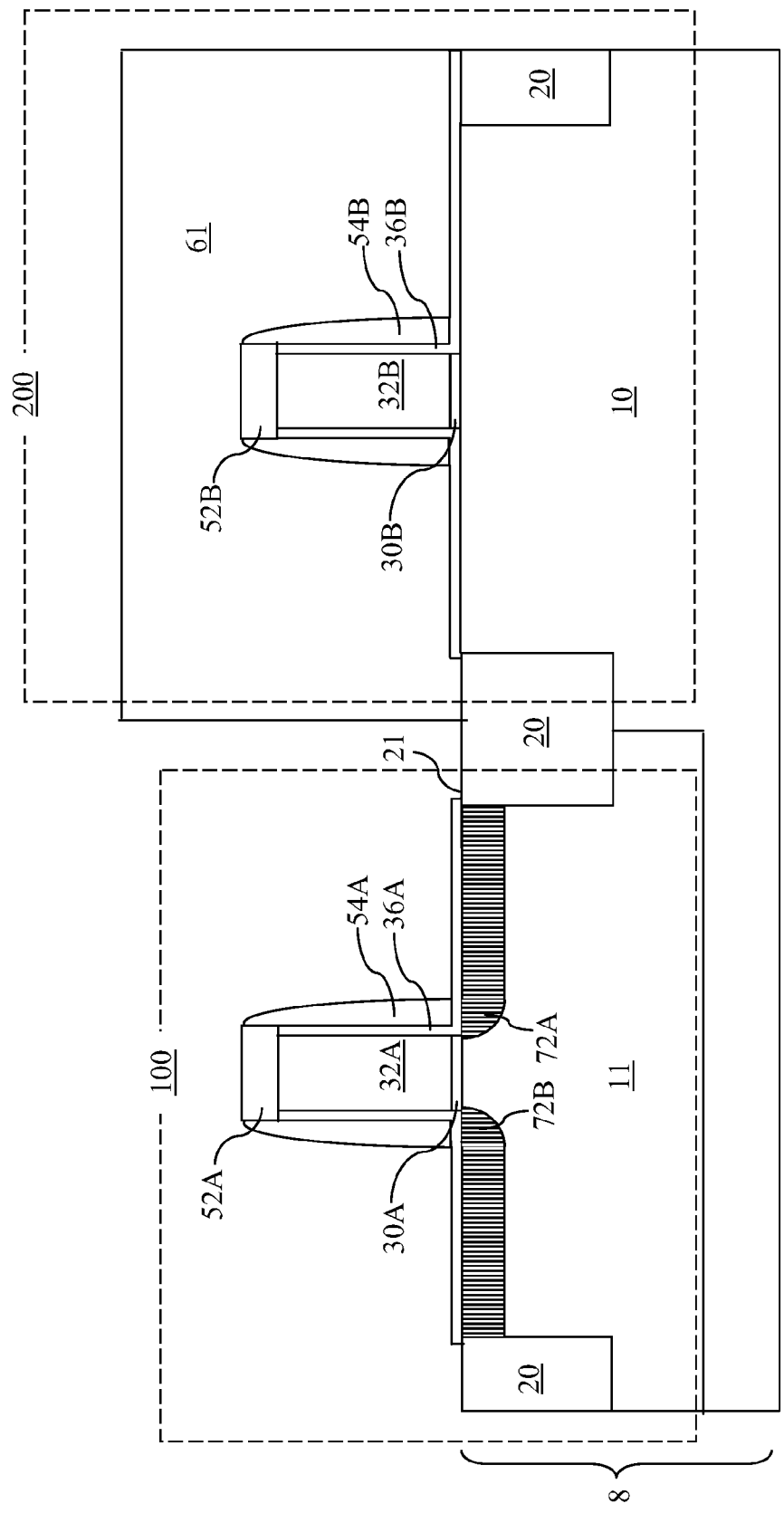
FIG. 2 is a vertical cross-sectional view of the exemplary semiconductor structure after formation of first source/drain extension regions.

Referring to FIG. 2, a masked ion implantation is performed into the second semiconductor region 11 employing a first photoresist 61 to form first source/drain extension regions (72A, 72B). Each of the first source/drain extension regions (72A, 72B) is a semiconductor material region including a doped semiconductor material. Specifically, the first photoresist 61 is applied on the semiconductor substrate 8 and lithographically patterned with a first block mask such that the first device region 100 is exposed and the second device region 200 is covered by the first photoresist 61. A first source extension region 72A and a first drain extension region 72B are formed in the first device region 100 by ion implantation of p-type dopants such as B, Ga, In, or a combination thereof. The dopant concentration of the first source/drain extension regions (72A, 72B) may be from $3.0\times10^{18}/cm^3$ to $3.0\times10^{21}/cm^3$, and typically from $3.0\times10^{19}/cm^3$ to $3.0\times10^{20}/cm^3$, although lesser and greater dopant concentrations are herein contemplated also. Halo regions (not shown) may be formed in the second semiconductor region 11 directly beneath the first source/drain extension regions (72A, 72B). After ion implantation, the first photoresist 61 is typically removed utilizing a conventional resist removal process. Alternate doping techniques such as plasma doping can be employed to form the first source/drain extension regions (72A, 72B) and/or the halo regions. Further, the formation of the first source/drain extension regions (72A, 72B) and/or the halo regions can be performed at other processing steps, such as after formation of source and drain regions illustrated in FIG. 6.

Figure 3:
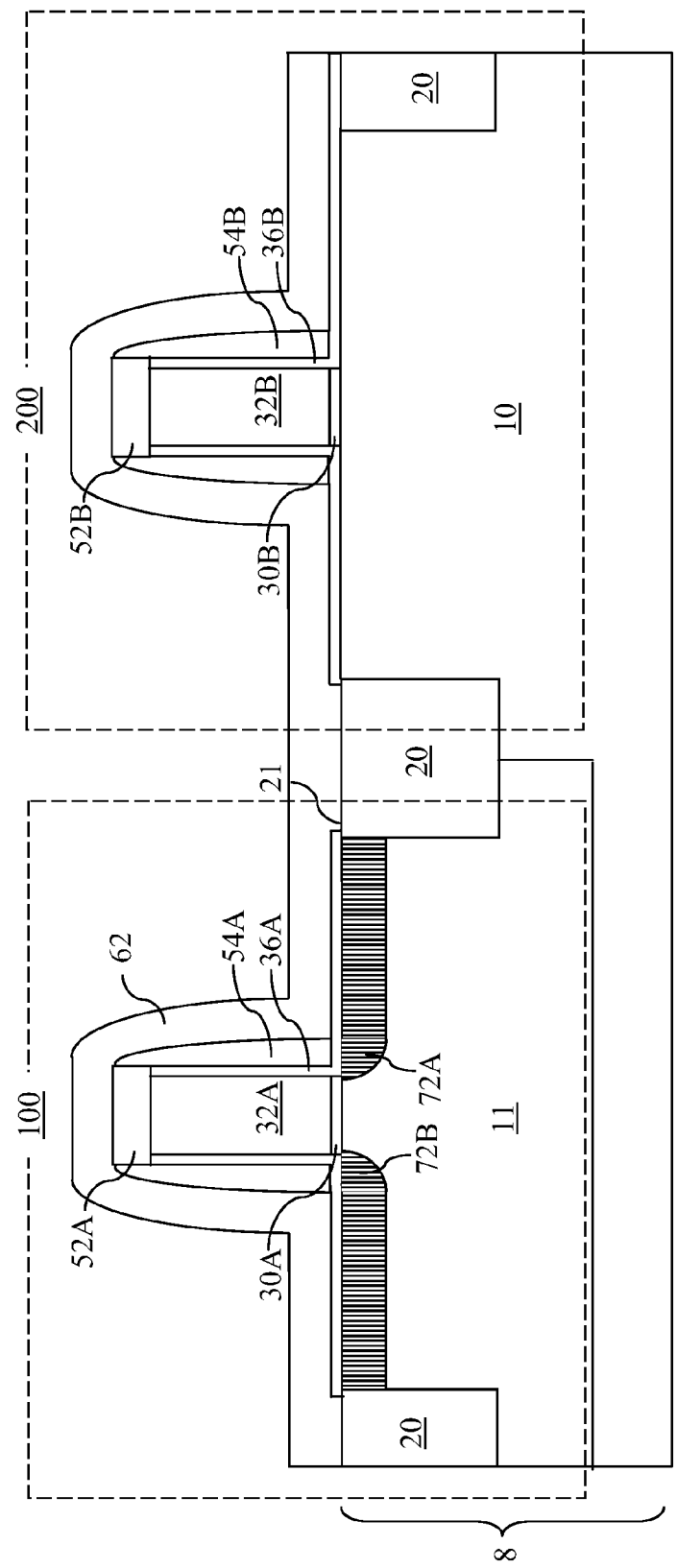
FIG. 3 is a vertical cross-sectional view of the exemplary semiconductor structure after formation of a first dielectric layer.

Referring to FIG. 3, a first dielectric layer 62 is formed on the first and second gate spacers (54A, 54B) and first and second gate nitride caps (52A, 52B). The first dielectric layer 62 includes a dielectric nitride or dielectric oxide. For example, the first dielectric layer 62 may include silicon nitride. The first dielectric layer 62 may be formed by plasma enhanced chemical vapor deposition (PECVD), low pressure chemical vapor deposition (LPCVD), rapid thermal chemical vapor deposition (RTCVD), high density plasma chemical vapor deposition (HDPCVD), or other known deposition techniques. The thickness of the first dielectric layer 62 may be from 20 nm to 100 nm, although lesser and greater thicknesses are also contemplated herein.

Figure 4:
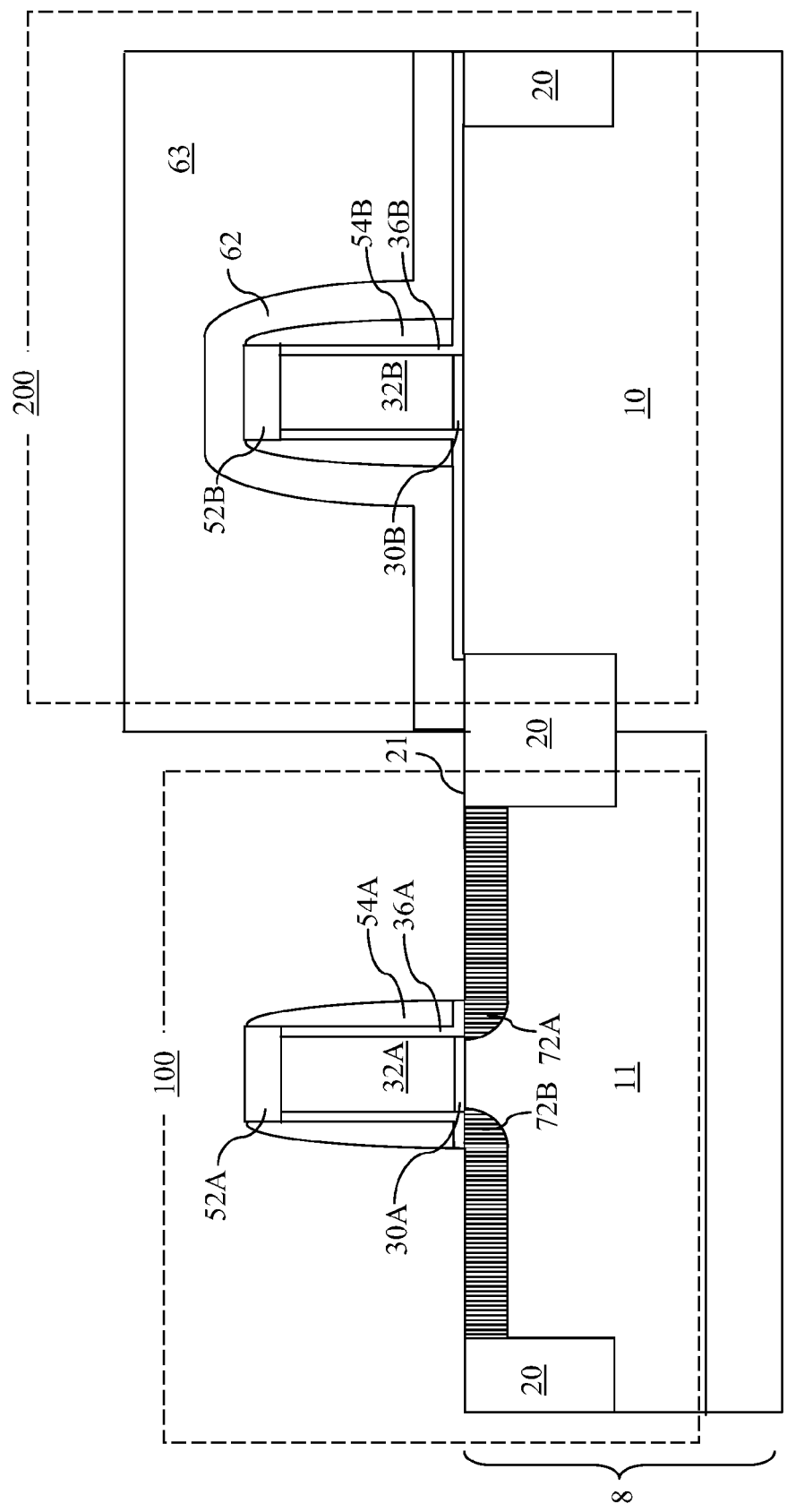
FIG. 4 is a vertical cross-sectional view of the exemplary semiconductor structure after patterning the first dielectric layer.

Referring to FIG. 4, a second photoresist 63 is applied to the first dielectric layer 62 and lithographically patterned to cover the second device region 200, while exposing the first device region 100. The portion of the first dielectric layer 62 in the first device region 100 is removed by an etch, which may be a dry etch or a wet etch. The exposed portion of the first semiconductor oxide layer 36A, if present, is removed. The first source/drain extension regions (72A, 72B) are exposed. The second photoresist 63 may be removed at this step, or alternately, may be removed after the formation of first source/drain trenches to be subsequently formed at the next step.

Figure 5:
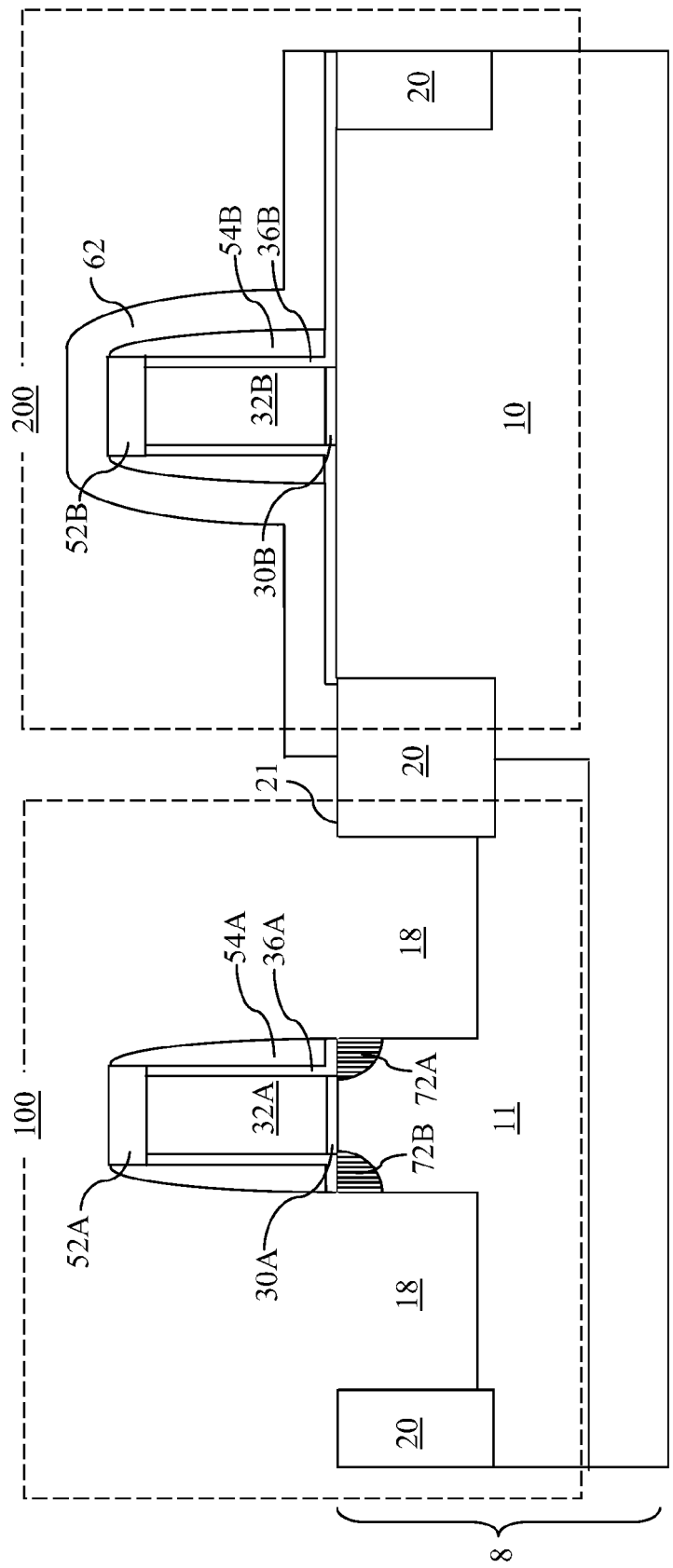
FIG. 5 is a vertical cross-sectional view of the exemplary semiconductor structure after formation of first source/drain trenches.

Referring to FIG. 5, first source/drain trenches 18 are formed by removing portions of the second semiconductor region 11 within the first device region 100 by an anisotropic etch such as a reactive ion etch. The first source/drain trenches 18 include a first source side trench formed on one side of the first gate electrode and a first drain side trench formed on the other side of the first gate electrode. Preferably, the reactive ion etch is selective to the first dielectric layer 62, the first gate nitride cap 52A, the first gate spacer 54A, and the shallow trench isolation structure 20. Some edges of the first source/drain trenches 18 are substantially self-aligned to the outer sidewalls of the first gate spacer 54A. Other edges of the first source/drain trenches 18 may be self-aligned to the edges of the shallow trench isolation structures 20. Preferably, the depth of the first source/drain trenches 18 is less than the depth of the shallow trench isolation structure 20. In case the semiconductor substrate 8 is an SOI substrate, the depth of the first source/drain trenches 18 is less than the thickness of a top semiconductor layer, i.e., a buried insulator layer is not exposed at the bottom of the first source/drain trenches. Presence of the second semiconductor region 11 at the bottom of the first source/drain trenches 18 enables epitaxial alignment of a first-semiconductor-material region (to be subsequently formed within the first source/drain trenches 18) to the lattice structure of the second semiconductor region 11. The depth of the first source/drain trenches 18 may be from 10 nm to 150 nm, and typically from 20 nm to 100 nm, although lesser and greater depths are contemplated herein also. The second photoresist 63 is subsequently removed. Alternately, it is also possible to omit formation of the first source/drain trenches 18 and to form source and drain regions in the original semiconductor material of the second semiconductor region 11.

Figure 6:
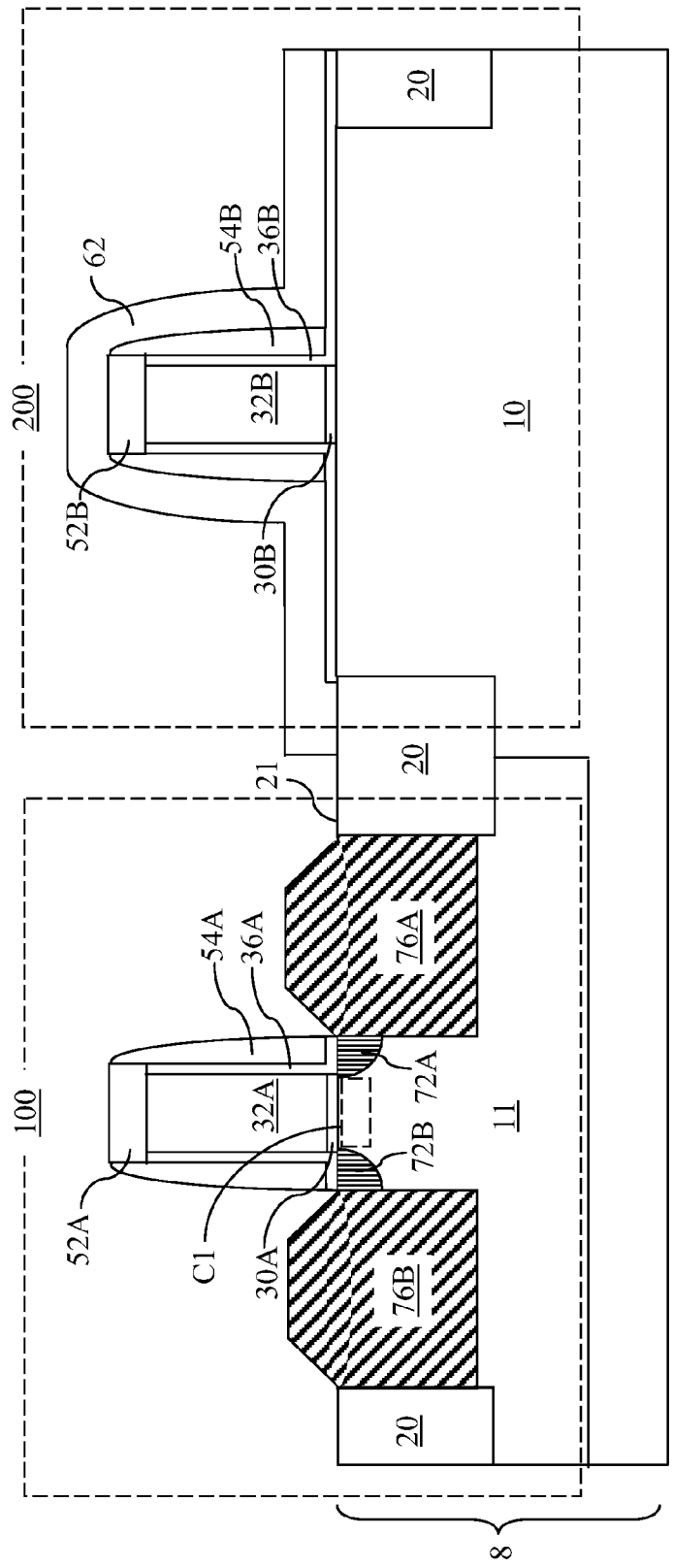
FIG. 6 is a vertical cross-sectional view of the exemplary semiconductor structure after formation of embedded first-semiconductor-material source/drain regions.

Referring to FIG. 6, embedded first-semiconductor-material regions including a first semiconductor material can be formed by in-situ doped selective epitaxy within the first source/drain trenches 18. The first semiconductor material is different from the semiconductor material of the second semiconductor region 11 in lattice spacing. For example, the embedded first-semiconductor-material regions can be embedded SiGe regions. The embedded first-semiconductor-material regions include single crystalline first semiconductor material portions, and include an embedded first-semiconductor-material source region 76A and an embedded first-semiconductor-material drain region 76B, which are herein collectively termed "embedded first-semiconductor-material source/drain regions" (76A, 76B). The embedded first-semiconductor-material source/drain regions (76A, 76B) are semiconductor material regions that include a p-type dopant, e.g., B, Ga, In, or a combination thereof, at a concentration from $3.0\times10^{19}/cm^3$ to $3.0\times10^{21}/cm^3$, and typically from $1.0\times10^{20}/cm^3$ to $1.0\times10^{21}/cm^3$, although lesser and greater concentrations are also contemplated herein.

In one embodiment, the embedded first-semiconductor-material source/drain regions (76A, 76B) include a silicon germanium alloy having a p-type doping. Preferably, the embedded first-semiconductor-material source/drain regions (76A, 76B) include germanium from 15% to 35% in atomic concentration, although lesser and greater concentration are explicitly contemplated herein also.

The embedded first-semiconductor-material source/drain regions (76A, 76B) are epitaxially aligned to the second semiconductor region 11. Due to the forced epitaxial alignment of the embedded first-semiconductor-material source/drain regions (76A, 76B) to the second semiconductor region 11, the embedded first-semiconductor-material source/drain regions (76A, 76B) apply a compressive uniaxial stress to a first channel C1 directly underneath the first gate dielectric 30A in the first device region 100.

Alternately, if formation of the first source/drain trenches is omitted at the processing step of FIG. 5, a raised source region and/or a raised drain region can be grown over exposed source and drain regions, e.g., on exposed surfaces of the first source/drain extension regions (72A, 72B), by selective epitaxial growth of a doped semiconductor material. Yet alternately, source and drain regions may be formed by introduction of electrical dopants by ion implantation and/or plasma doping without forming first source drain/trenches and without forming raised source/drain regions.

Figure 7:
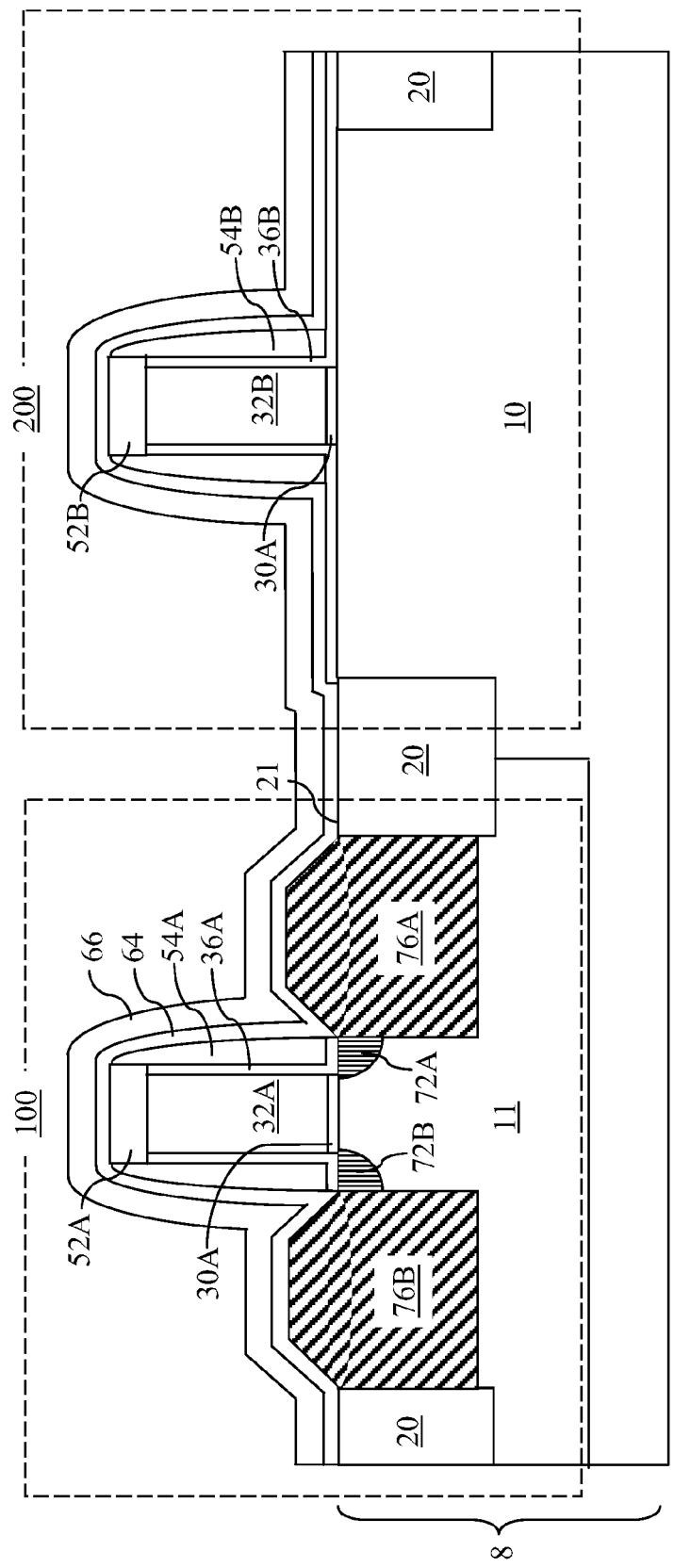
FIG. 7 is a vertical cross-sectional view of the exemplary semiconductor structure after formation of a second dielectric layer.

Referring to FIG. 7, an etch-stop dielectric layer 64 and a second dielectric layer 66 are formed on the embedded firstsemiconductor-material source/drain regions (76A, 76B) and the first and second gate spacers (54A, 54B). The second dielectric layer 66 includes a dielectric oxide or a dielectric nitride. For example, the second dielectric layer 66 may include silicon nitride. The etch-stop dielectric layer 64 includes a dielectric material that is different from the material of the second dielectric layer 66. If the second dielectric layer 66 includes silicon nitride, the etch-stop dielectric layer 64 may include silicon oxide. The thickness of the second dielectric layer 66 may be from 20 nm to 100 nm, although lesser and greater thicknesses are also contemplated herein. The thickness of the etch-stop dielectric layer 64 may be from 5 nm to 30 nm, although lesser and greater thicknesses are also contemplated herein.

Figure 8:
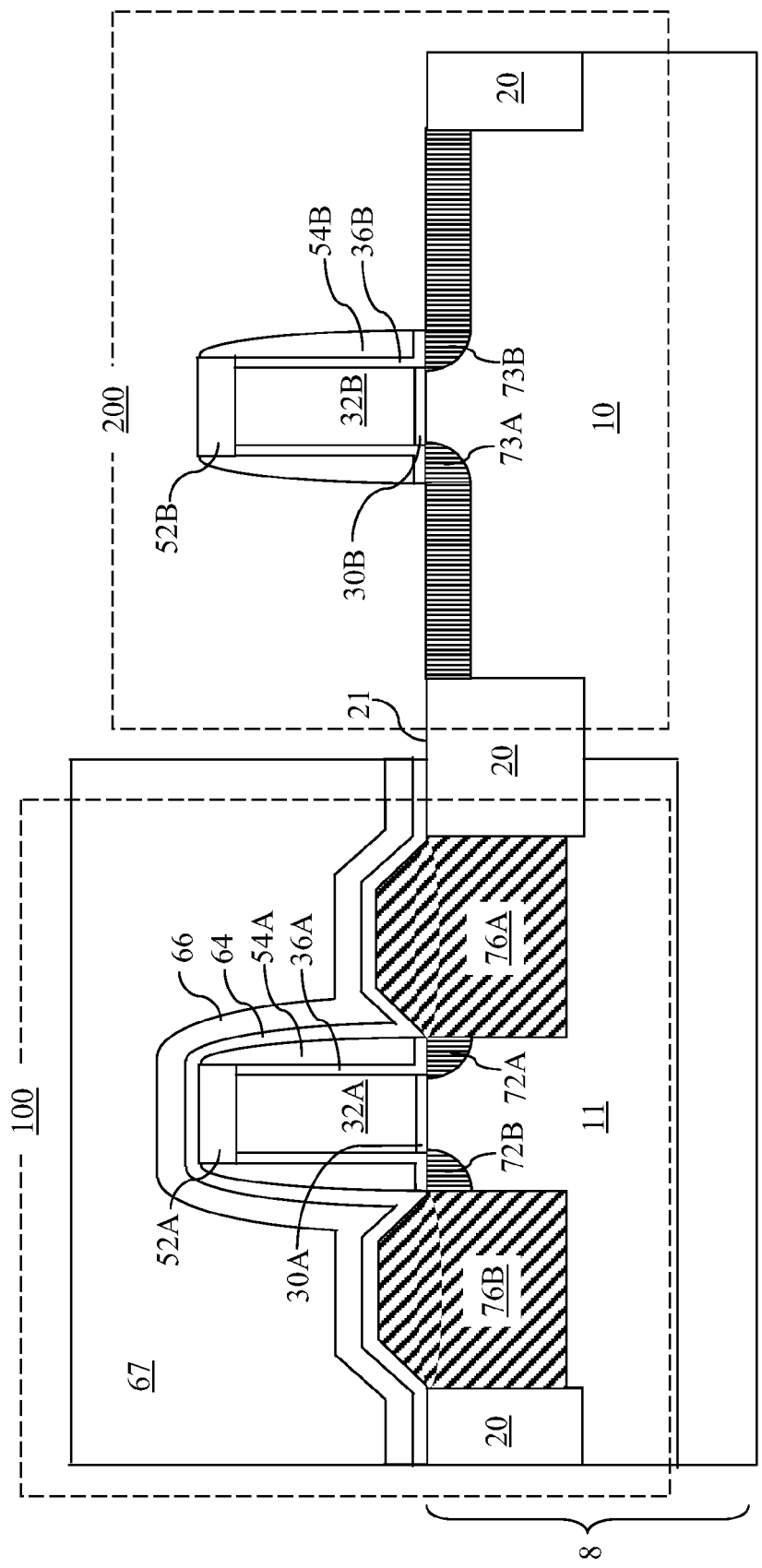
FIG. 8 is a vertical cross-sectional view of the exemplary semiconductor structure after patterning the first dielectric layer and formation of second source/drain extension regions.

Referring to FIG. 8, a third photoresist 67 is applied over the second dielectric layer 66 and lithographically patterned to expose the second device region 200, while blocking the first device region 100. The exposed portions of the second dielectric layer 66 in the second device region 200 is removed by a first etch, which may be a wet etch or a dry etch employing the third photoresist 67 as an etch mask. Preferably, the first etch is selective to the etch-stop dielectric layer 64. Exposed portions of the etch-stop dielectric layer 64 in the second device region 200 are removed by a second etch employing the third photoresist 67 as an etch mask. Preferably, the second etch is selective to the second gate spacer 54B, the second gate cap nitride 52B, and the first semiconductor region 10.

A masked ion implantation may be performed into the first semiconductor region 10 employing the third photoresist 67 as a blocking mask to form second source/drain extension regions (73A, 73B). A second source extension region 73A and a second drain extension region 73B are formed in the second device region 200 by ion implantation of n-type dopants such as P, As, Sb, or a combination thereof. The dopant concentration of the second source/drain extension regions (73A, 73B) may be from $3.0\times10^{18}/cm^3$ to $3.0\times10^{21}/cm^3$, and typically from $3.0\times10^{19}/cm^3$ to $3.0\times10^{20}/cm^3$, although lesser and greater dopant concentrations are herein contemplated also. Halo regions (not shown) may be formed in the first semiconductor region directly 10 beneath the second source/drain extension regions (73A, 73B). The third photoresist 67 may be removed at this point, or alternately, may be removed after the formation of second source/drain trenches to be subsequently formed at the next step. Alternate doping techniques such as plasma doping can be employed to form the second source/drain extension regions (73A, 73B) and/or the halo regions. Further, the formation of the first source/drain extension regions (73A, 73B) and/or the halo regions can be performed at other processing steps, such as after formation of source and drain regions illustrated in FIG. 10.

Figure 9:
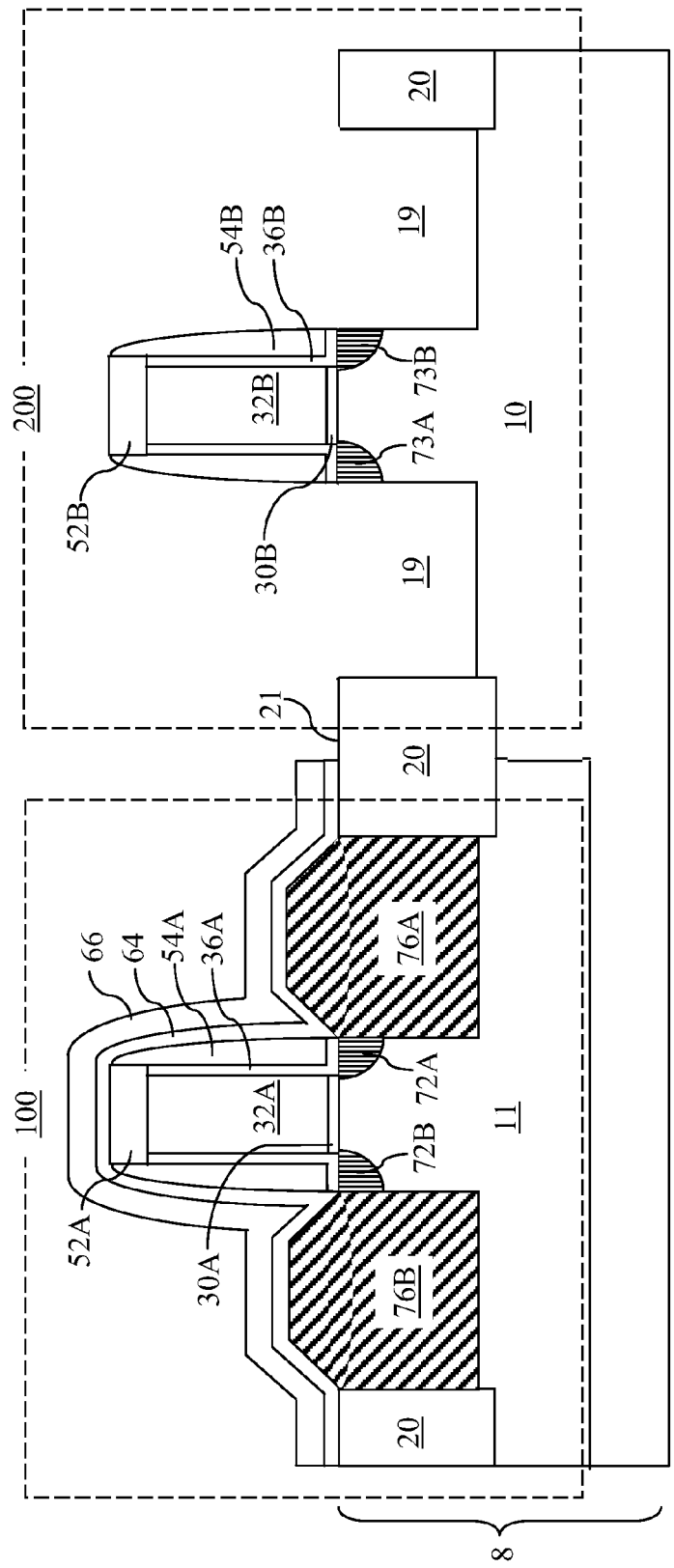
FIG. 9 is a vertical cross-sectional view of the exemplary semiconductor structure after formation of second source/drain trenches.

Referring to FIG. 9, second source/drain trenches 19 are formed by removing portions of the first semiconductor region 10 within the second device region 200 by an anisotropic etch such as a reactive ion etch. The second source/drain trenches 19 include a second source side trench formed on one side of the second gate electrode and a second drain side trench formed on the other side of the second gate electrode. Preferably, the reactive ion etch is selective to the second dielectric layer 66, the second gate nitride cap 52B, the second gate spacer 54B, and the shallow trench isolation structure 20. Some edges of the second source/drain trenches 19 are substantially self-aligned to the outer sidewalls of the second gate spacer 54B. Other edges of the second source/drain trenches 19 may be self-aligned to the edges of the shallow trench isolation structures 20. Preferably, the depth of the second source/drain trenches 19 is less than the depth of the shallow trench isolation structure 20. In case the semiconductor substrate 8 is an SOI substrate, the depth of the second source/drain trenches 19 is less than the thickness of a top semiconductor layer, i.e., a buried insulator layer is not exposed at the bottom of the second source/drain trenches. Presence of the first semiconductor region 10 at the bottom of the second source/drain trenches 19 enables epitaxial alignment of a second-semiconductor-material alloy to be subsequently formed within the second source/drain trenches 19 to the lattice structure of the first semiconductor region 10. The depth of the second source/drain trenches 19 may be from 10 nm to 150 nm, and typically from 20 nm to 100 nm, although lesser and greater depths are contemplated herein also. Alternately, it is also possible to omit formation of the second source/drain trenches 19 and to form source and drain regions in the original semiconductor material of the first semiconductor region 10.

Figure 10:
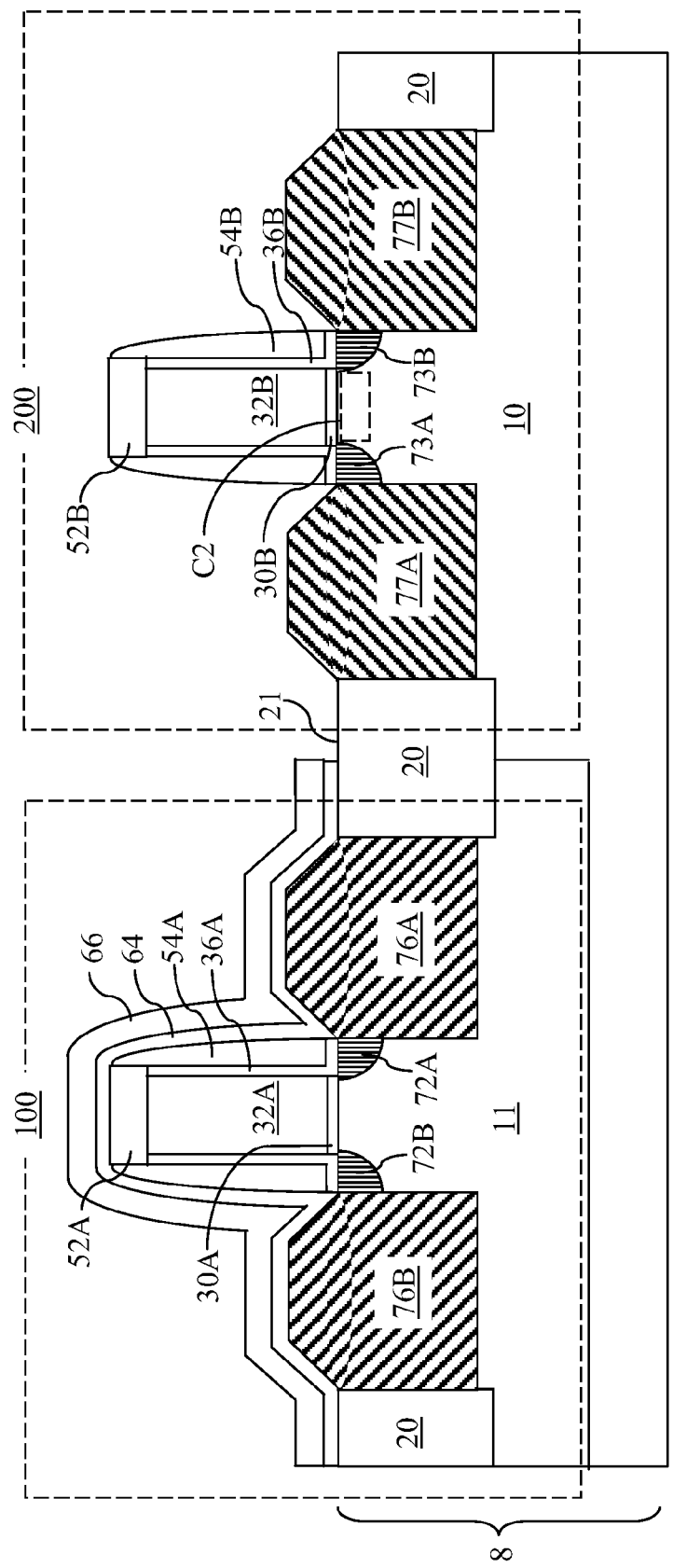
FIG. 10 is a vertical cross-sectional view of the exemplary semiconductor structure after formation of embedded second-semiconductor-material source/drain regions.

Referring to FIG. 10, embedded second-semiconductor-material regions including a second semiconductor material can be formed by in-situ doped selective epitaxy within the second source/drain trenches 19. The second semiconductor material is different from the semiconductor material of the first semiconductor region 10 and the first semiconductor material in lattice spacing. For example, the embedded second-semiconductor-material regions can be embedded silicon-carbon alloy regions. The embedded second-semiconductor-material regions include single crystalline second-semiconductor-material alloy portions, and include an embedded second-semiconductor-material source region 77A and an embedded second-semiconductor-material drain region 77B, which are herein collectively termed "embedded second-semiconductor-material source/drain regions" (77A, 77B). The embedded second-semiconductor-material source/drain regions (77A, 77B) are semiconductor regions that include an n-type dopant, e.g., P, As, Sb, or a combination thereof, at a concentration from $3.0\times10^{19}/cm^3$ to $3.0\times10^{21}/cm^3$, and typically from $1.0\times10^{20}/cm^3$ to $1.0\times10^{21}/cm^3$, although lesser and greater concentrations are also contemplated herein.

In one embodiment, the embedded second-semiconductor-material source/drain regions (77A, 77B) can include a silicon carbon alloy having an n-type doping. Preferably, the embedded second-semiconductor-material source/drain regions (77A, 77B) include carbon from 0.5% to 4.0% in atomic concentration, although lesser and greater concentration are explicitly contemplated herein also.

The embedded second-semiconductor-material source/drain regions (77A, 77B) are epitaxially aligned to the first semiconductor region 10. Due to the forced epitaxial alignment of the embedded second-semiconductor-material source/drain regions (77A, 77B) to the first semiconductor region 10, the embedded second-semiconductor-material source/drain regions (77A, 77B) apply a tensile uniaxial stress to a second channel C2 directly underneath the second gate dielectric 30B in the second device region 200.

Alternately, if formation of the second source/drain trenches is omitted at the processing step of FIG. 9, a raised source region and/or a raised drain region can be grown over exposed source and drain regions, e.g., on exposed surfaces of the second source/drain extension regions (73A, 73B), by selective epitaxial growth of a doped semiconductor material. Yet alternately, source and drain regions may be formed by introduction of electrical dopants by ion implantation and/or plasma doping without forming first source drain/trenches and without forming raised source/drain regions.

Figure 11:
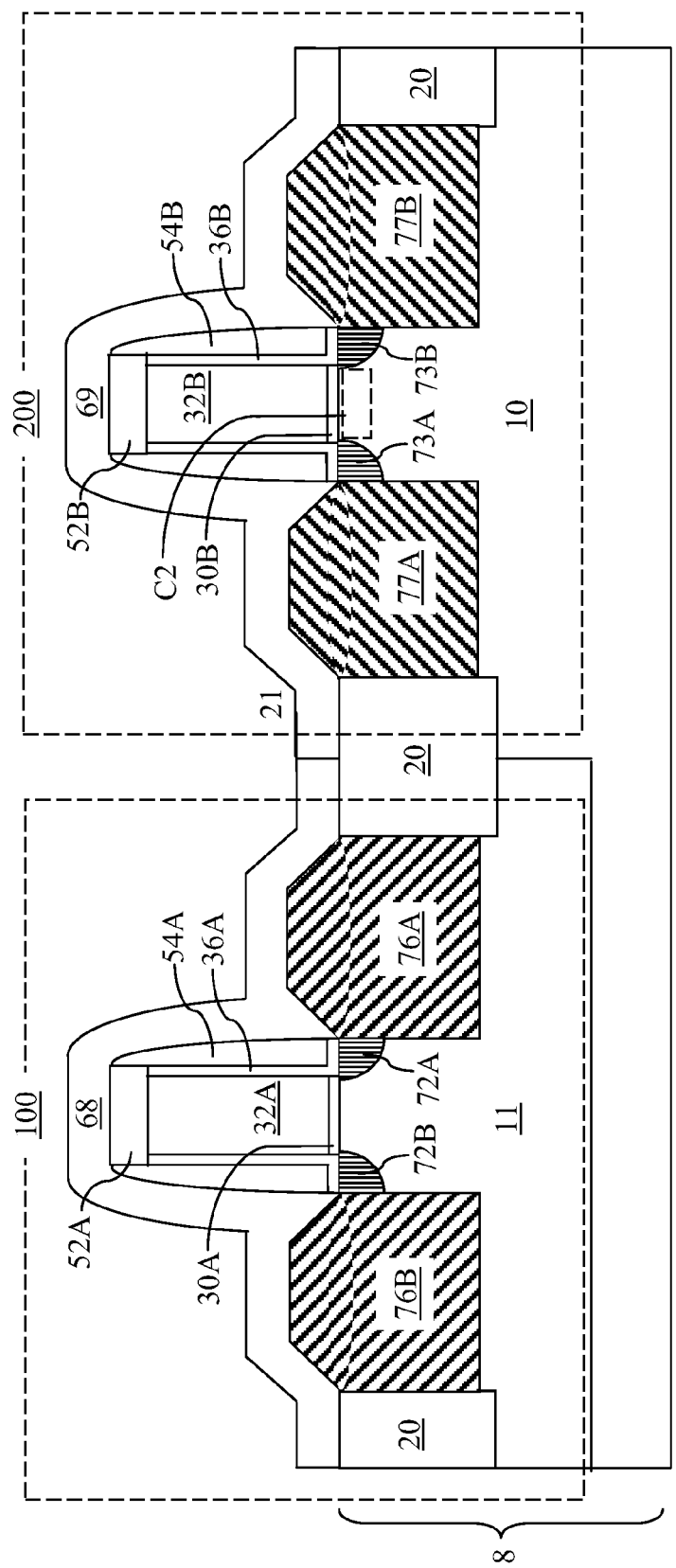
FIG. 11 is a vertical cross-sectional view of the exemplary semiconductor structure after removal of the second dielectric layer and formation of a first stress-generating dielectric liner and a second stress-generating dielectric liner.

Referring to FIG. 11, the etch-stop dielectric layer 64 and the second dielectric layer 66 can be removed selective to semiconductor materials and the materials of the first and second dielectric gate caps (52A, 52B) and the first and second gate spacers (54A, 54B). A first stress-generating dielectric liner 68 and a second stress-generating dielectric liner 69 can be formed in the first device region 100 and the second device region, respectively. The first stress-generating dielectric liner 68 overlies a first gate structure (30A, 32A, 36A, 52A, 54A) and the embedded first-semiconductor-material source/drain regions (76A, 76B). The second stress-generating dielectric liner 69 overlies a second gate structure (30B, 32B, 36B, 52B, 54B) and the embedded second-semiconductor-material source/drain regions (77A, 77B). The first stress-generating dielectric liner 68 and the second stress-generating dielectric liner 69 are typically dielectric silicon nitride layers that are formed by plasma enhanced chemical vapor deposition. If the first device region 100 includes a p-type field effect transistor and the second device region 200 includes an n-type field effect transistor, the first stress-generating dielectric liner 68 can be a dielectric liner that applies a compressive stress to underlying structures and a second stress-generating dielectric liner 69 can be a dielectric liner that applies a tensile stress to underlying structures. The first stress-generating dielectric liner 68 and the second stress-generating dielectric liner 69 are optional, i.e., may, or may not, be present.

Figure 12:
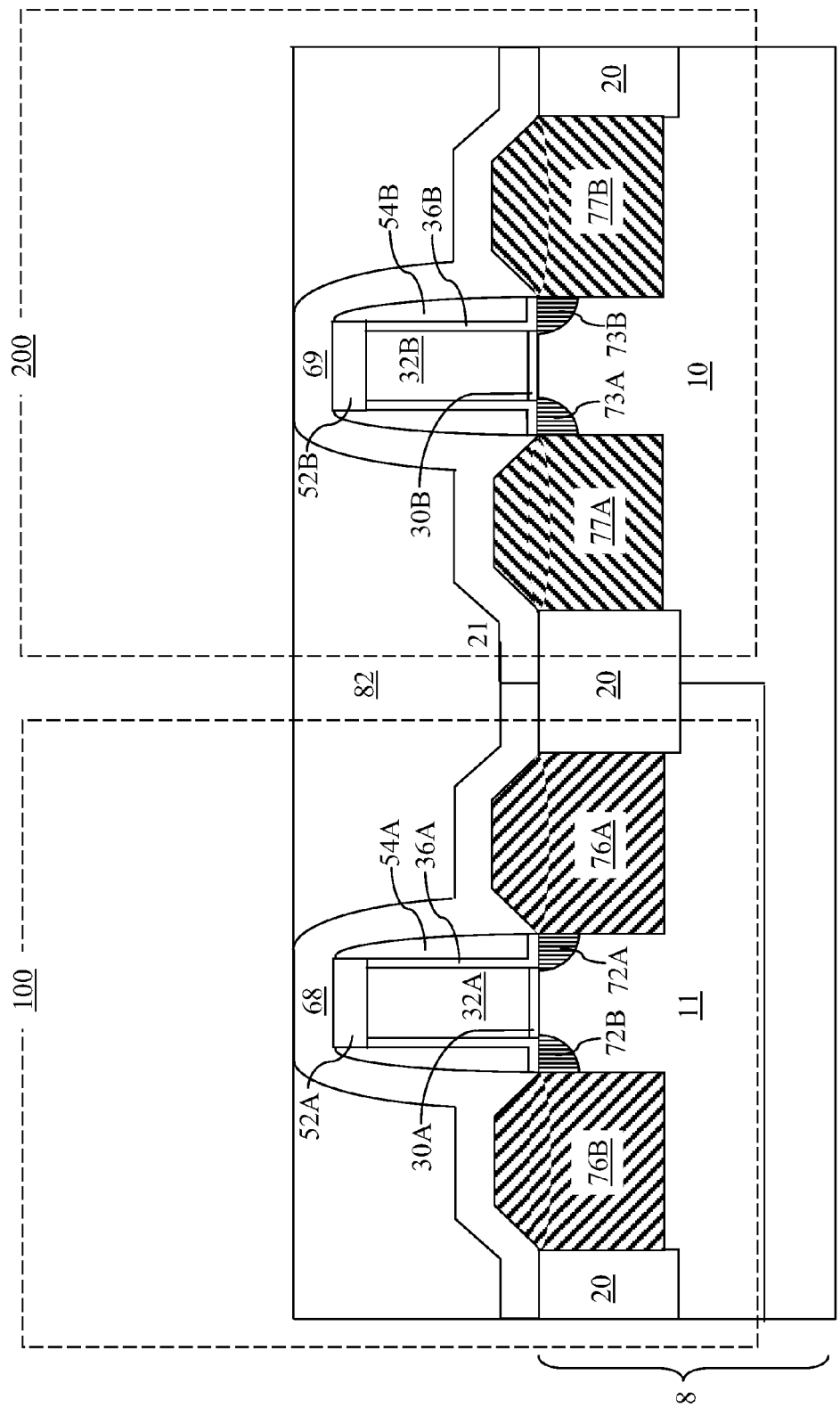
FIG. 12 is a vertical cross-sectional view of the exemplary semiconductor structure after formation of a contact level dielectric material layer.

Referring to FIG. 12, a contact level dielectric material layer 82 is deposited over the first stress-generating dielectric liner 68 and the second stress-generating dielectric liner 69, if present, and/or over the first gate structure (30A, 32A, 36A, 52A, 54A), the embedded first-semiconductor-material source/drain regions (76A, 76B), the second gate structure (30B, 32B, 36B, 52B, 54B), and the embedded second-semiconductor-material source/drain regions (77A, 77B). The contact level dielectric layer 82 may include a mobile ion barrier layer (not shown). The contact level dielectric layer 82 may include, for example, a CVD oxide such as undoped silicate glass (USG), borosilicate glass (BSG), phosphosilicate glass (PSG), fluorosilicate glass (FSG), borophosphosilicate glass (BPSG), or a combination thereof. The contact dielectric material layer 82 is planarized, for example, by chemical mechanical planarization, a recess etch, or a combination thereof. For example, the topmost surface of the contact level dielectric layer 82 as planarized can have a planar top surface that lies within the same horizontal plane as the top surfaces of the first stress-generating dielectric liner 68 and the second stress-generating dielectric liner 69, if present, or within the same horizontal plane as the top surfaces of the first and second dielectric gate caps (52A, 52B).

Figure 13:
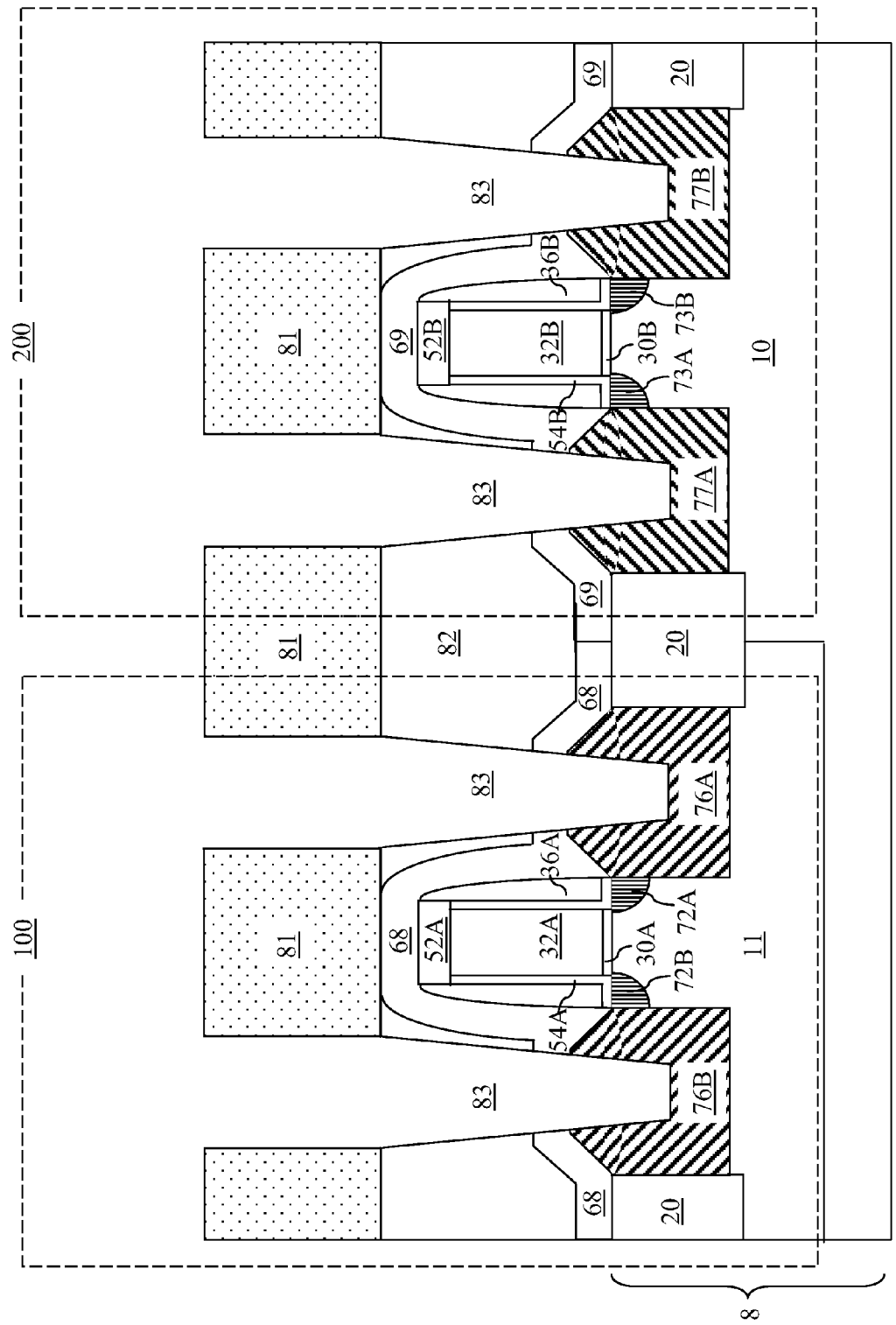
FIG. 13 is a vertical cross-sectional view of the exemplary semiconductor structure after formation of trenches that extend into various source/drain regions.

Referring to FIG. 13, a first photoresist 81 is applied to the top surface of the contact level dielectric layer 82 and is lithographically patterned to form openings therein. The openings in the first photoresist 81 overlie areas in which formation of metal semiconductor alloys are desired. For example, the openings in the first photoresist 81 may be within areas of the embedded first-semiconductor-material source/drain regions (76A, 76B) and the embedded second-semiconductor-material source/drain regions (77A, 77B). Optionally, additional openings (not shown) in the first photoresist 81 may be formed in portions of areas of the first and second gate conductors (32A, 32B).

Trenches 83 are formed through the contact level dielectric layer 82 and the first and second stress-generating dielectric liners (68, 69) and upper portions of the embedded first-semiconductor-material source/drain regions (76A, 76B) and the embedded second-semiconductor-material source/drain regions (77A, 77B). Each trench 83 can be formed by first anisotropically etching through the contact level dielectric layer 82 and one of the first and second stress-generating dielectric liners (68, 69) to expose top surfaces of the embedded first-semiconductor-material source/drain regions (76A, 76B) and the embedded second-semiconductor-material source/drain regions (77A, 77B). Employing the first photoresist 81 as an etch mask, the anisotropic etch continues employing a different etch chemistry or the same chemistry into the upper portions of the embedded first-semiconductor-material source/drain regions (76A, 76B) and the embedded second-semiconductor-material source/drain regions (77A, 77B). Thus, each trench 83 extends from a top surface of the contact level dielectric material layer 82 into a semiconductor material portion. Alternately, an anisotropic etch may be employed first to expose a semiconductor surface, and then a semiconductor specific wet etch chemistry such as a KOH etch may be employed.

The sidewalls of each trench 83 contiguously extend from the topmost surface of the contact level dielectric material layer 83 into the semiconductor material region, which can be one of the embedded first-semiconductor-material source/drain regions (76A, 76B) and the embedded second-semiconductor-material source/drain regions (77A, 77B). The depth of the anisotropic etch can be controlled so that the trenches 83 extend below a planar top surface of the semiconductor substrate 8 such as the interface between the first semiconductor region 10 and the second gate dielectric 30B or the interface between the second semiconductor region 11 and the first gate dielectric 30A. Thus, the bottom surface of each trench 83 can be located between a horizontal plane that includes the bottom surface of the first and second gate dielectrics (30A, 30B) and another horizontal plane that coincides with a bottommost surface of the embedded first-semiconductor-material source/drain regions (76A, 76B) and the embedded second-semiconductor-material source/drain regions (77A, 77B).

Figure 14:
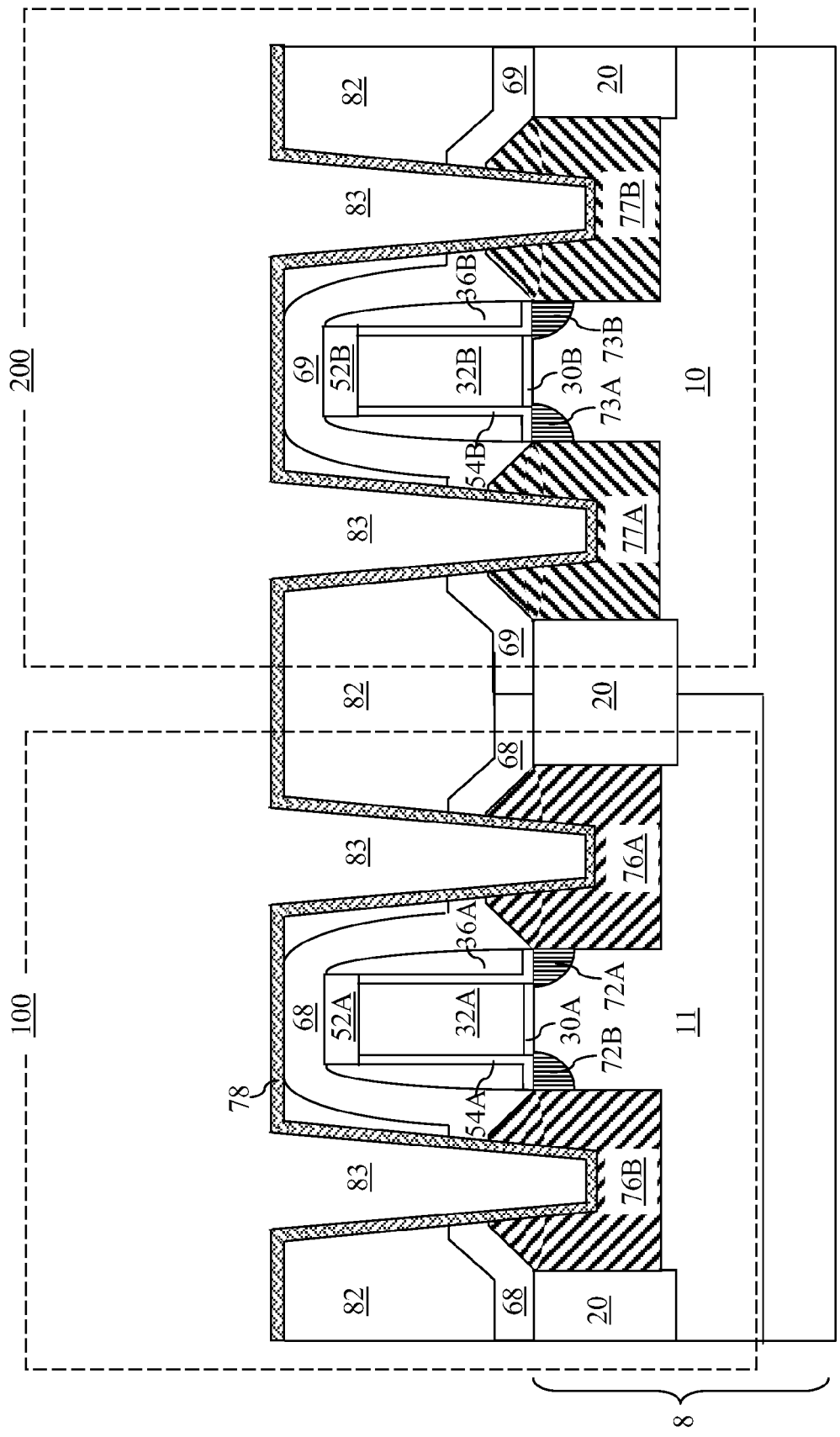
FIG. 14 is a vertical cross-sectional view of the exemplary semiconductor structure after formation of a metal layer.

Referring to FIG. 14, a metal layer 78 is deposited on all exposed surfaces in the trenches 83 and the top surface of the contact level dielectric layer. The metal layer 78 includes a metal that can form a metal semiconductor alloy by interacting with the semiconductor materials of the embedded first-semiconductor-material source/drain regions (76A, 76B) and the embedded second-semiconductor-material source/drain regions (77A, 77B). Materials that can be employed for the metal layer 78 include, but are not limited to, Ti, Ta, V, W, Mo, Ni, Pt, and alloys thereof. The thickness of the metal layer 78 is typically less than one half of the width of the bottom portion of the trenches 83 prior to deposition of the metal layer 83. Typically, the thickness of the metal layer 78 is from 10 nm to 30 nm, although lesser and greater thicknesses can also be employed.

Figure 15:
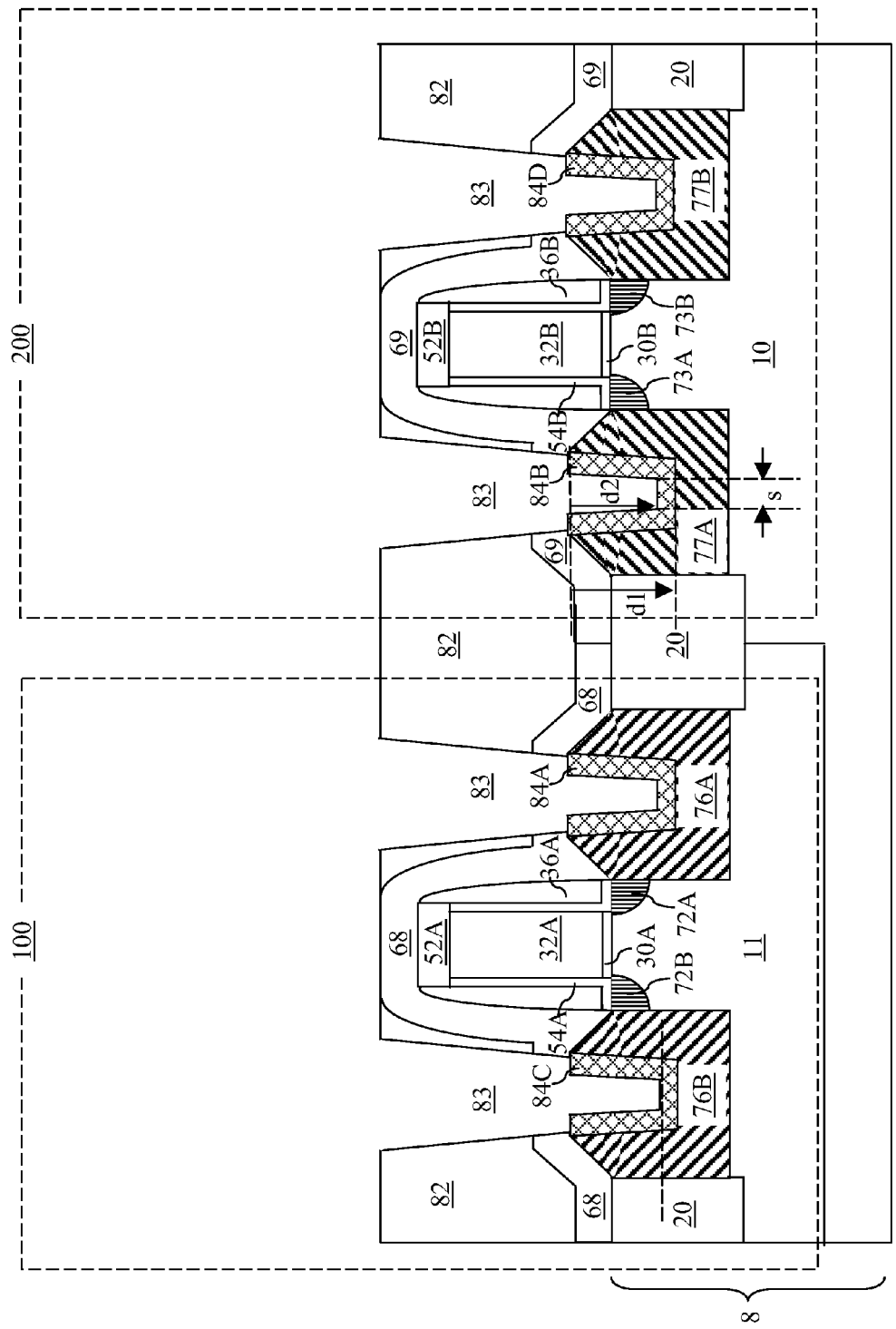
FIG. 15 is a vertical cross-sectional view of the exemplary semiconductor structure after formation of various metal semiconductor alloy regions.

Referring to FIG. 15, various metal semiconductor alloy regions are formed by inducing an interdiffusion and reaction between the metal in the metal layer 78 and the semiconductor materials that contact the metal layer 78. The semiconductor materials are located within surface portions of semiconductor material regions, i.e., on the sidewalls and bottom surface of the trench 83 that form interfaces between the metal layer 78 and the semiconductor material regions. The semiconductor material regions include the embedded first-semiconductor-material source/drain regions (76A, 76B) and the embedded second-semiconductor-material source/drain regions (77A, 77B). The various metal semiconductor alloy regions include a first metal semiconductor alloy region 84A formed on the embedded first-semiconductor-material source region 76A, a second metal semiconductor alloy region 84B formed on the embedded first-semiconductor-material drain region 76B, a third metal semiconductor alloy region 84C formed on the embedded second-semiconductor-material source region 77A, a fourth metal semiconductor alloy region 84D formed on the embedded second-semiconductor-material drain region 77B. The various metal semiconductor alloy regions (84A, 84B, 84C, 84D) are formed by diffusion the metal into the various semiconductor material regions (76A, 76B, 77A, 77B) through sidewalls and bottom surfaces of the trenches 83. The unreacted portions of the metal layer 78 are removed selective to the various metal semiconductor alloy regions (84A, 84B, 84C, 84D).

The entirety of each metal semiconductor alloy region (84A, 84B, 84C, or 84D) is of integral construction, i.e., contiguously connected throughout. Each metal semiconductor alloy region (84A, 84B, 84C, or 84D) includes an upper metal semiconductor alloy portion and a lower metal semiconductor alloy portion. The bottommost surface of each metal semiconductor alloy region (84A, 84B, 84C, or 84D) can be at a first depth $d1$ from the topmost portions of the embedded first-semiconductor-material source/drain regions (76A, 76B) and the embedded second-semiconductor-material source/drain regions (77A, 77B).

Within each upper metal semiconductor alloy portion, an inner sidewall and an outer sidewall of the upper metal semiconductor alloy portion are laterally spaced by a substantially constant width throughout. Each lower metal semiconductor alloy portion does not include a pair of an inner sidewall and an outer sidewall having a constant spacing therebetween. If a metal semiconductor alloy region (84A, 84B, 84C, 84D) includes a horizontal bottom portion having a substantially constant thickness, the top surface of the horizontal portion can be at a second depth $d2$ from the topmost portion of the embedded first-semiconductor-material source/drain regions (76A, 76B) and the embedded second-semiconductor-material source/drain regions (77A, 77B). In this case, the boundary between the upper metal semiconductor alloy portion and the lower metal semiconductor alloy portion in any of the metal semiconductor alloy region (84A, 84B, 84C, or 84D) can be at the depth of the upper surface of the horizontal portion.

The boundary between the upper metal semiconductor alloy portion and the lower metal semiconductor alloy portion within the third metal semiconductor alloy region 84C is represented by a horizontal dotted line. The lower metal semiconductor alloy portions of the metal semiconductor alloy regions (84A, 84B, 84C, or 84D) can be formed between a horizontal plane that includes the bottom surface of the gate dielectrics (30A, 30B) and a bottommost surface of the embedded first-semiconductor-material source/drain regions (76A, 76B) or the embedded second-semiconductor-material source/drain regions (77A, 77B). Inner sidewalls of a metal semiconductor alloy regions (84A, 84B, 84C, 84D) are laterally spaced at least by a spacing s throughout the entirety of the upper metal semiconductor alloy portion therein.

Figure 16:
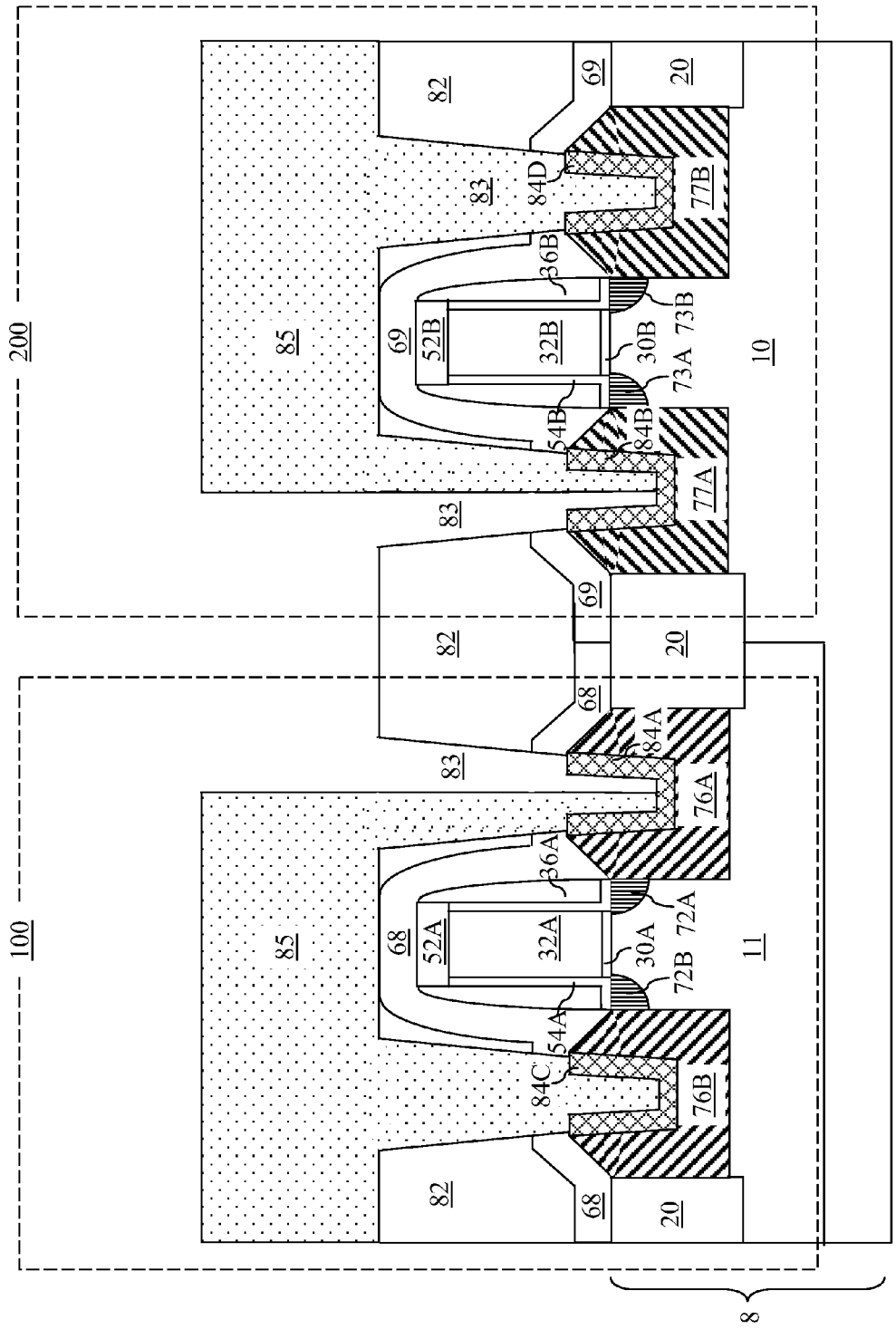
FIG. 16 is a vertical cross-sectional view of the exemplary semiconductor structure after application and patterning of a photoresist.

Referring to FIG. 16, a first optional processing step may be employed if formation of a local interconnect structure within the contact level dielectric layer 82 is desired. In this case, a second photoresist 85 can be optionally applied and lithographically patterned to form openings in an area overlapping with at least two trenches 83.

Figure 17:
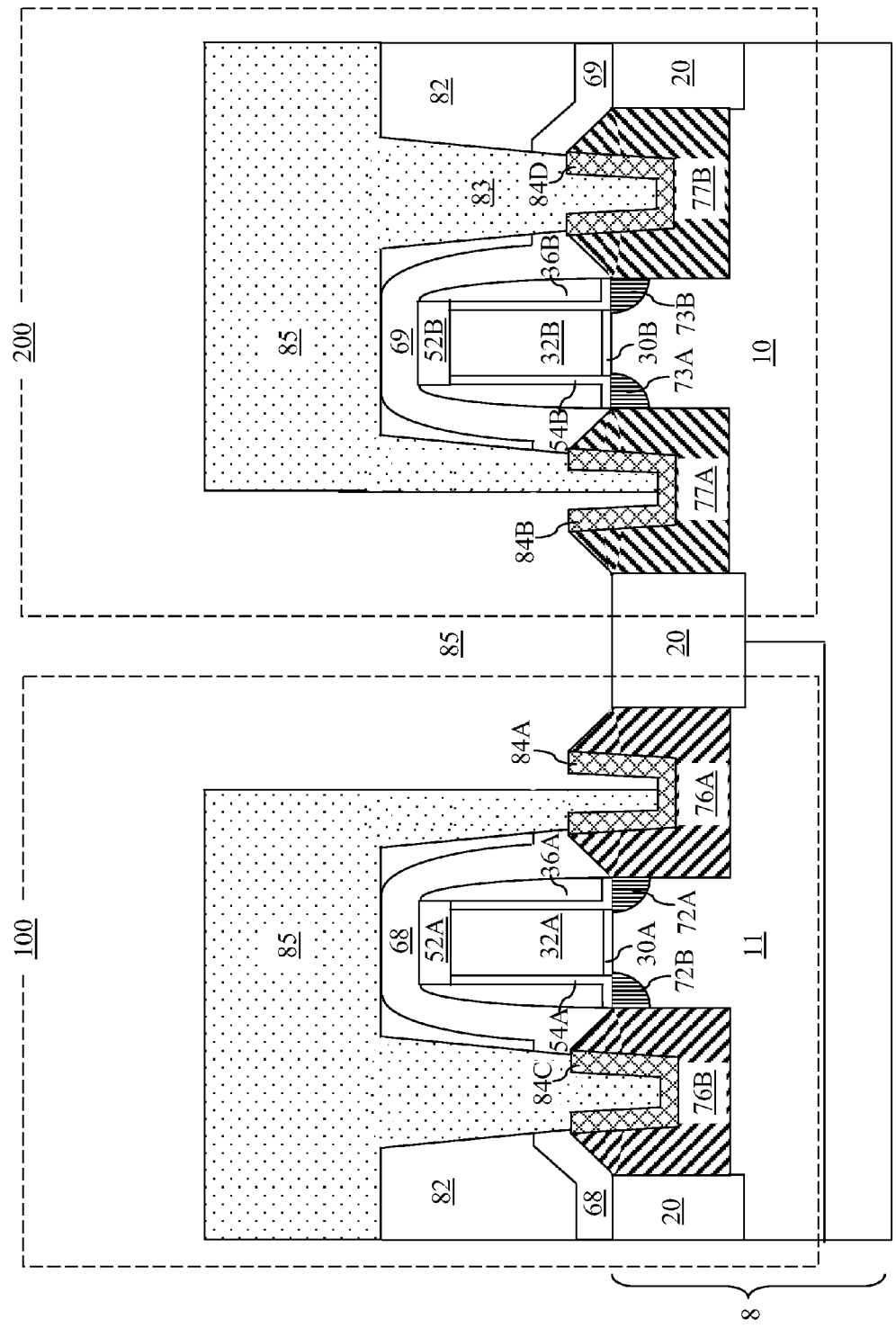
FIG. 17 is a vertical cross-sectional view of the exemplary semiconductor structure after removal of the exposed portions of the contact level dielectric material layer.

Referring to FIG. 17, a second optional processing step may be employed if formation of a local interconnect structure within the contact level dielectric layer 82 is desired. In an etch process that employs the second photoresist 85 as an etch mask, the exposed portions of the contact level dielectric material layer 82 and any portion of the first and second stress-generating dielectric liners (68, 69), if present, are removed selective to the underlying semiconductor materials, underlying metal semiconductor alloy portions (i.e., portions of the first and second metal semiconductor alloy regions (84A, 84B), and underlying portions of the shallow trench isolation structure 20. The second photoresist 85 is subsequently removed, for example, by ashing.

Figure 18:
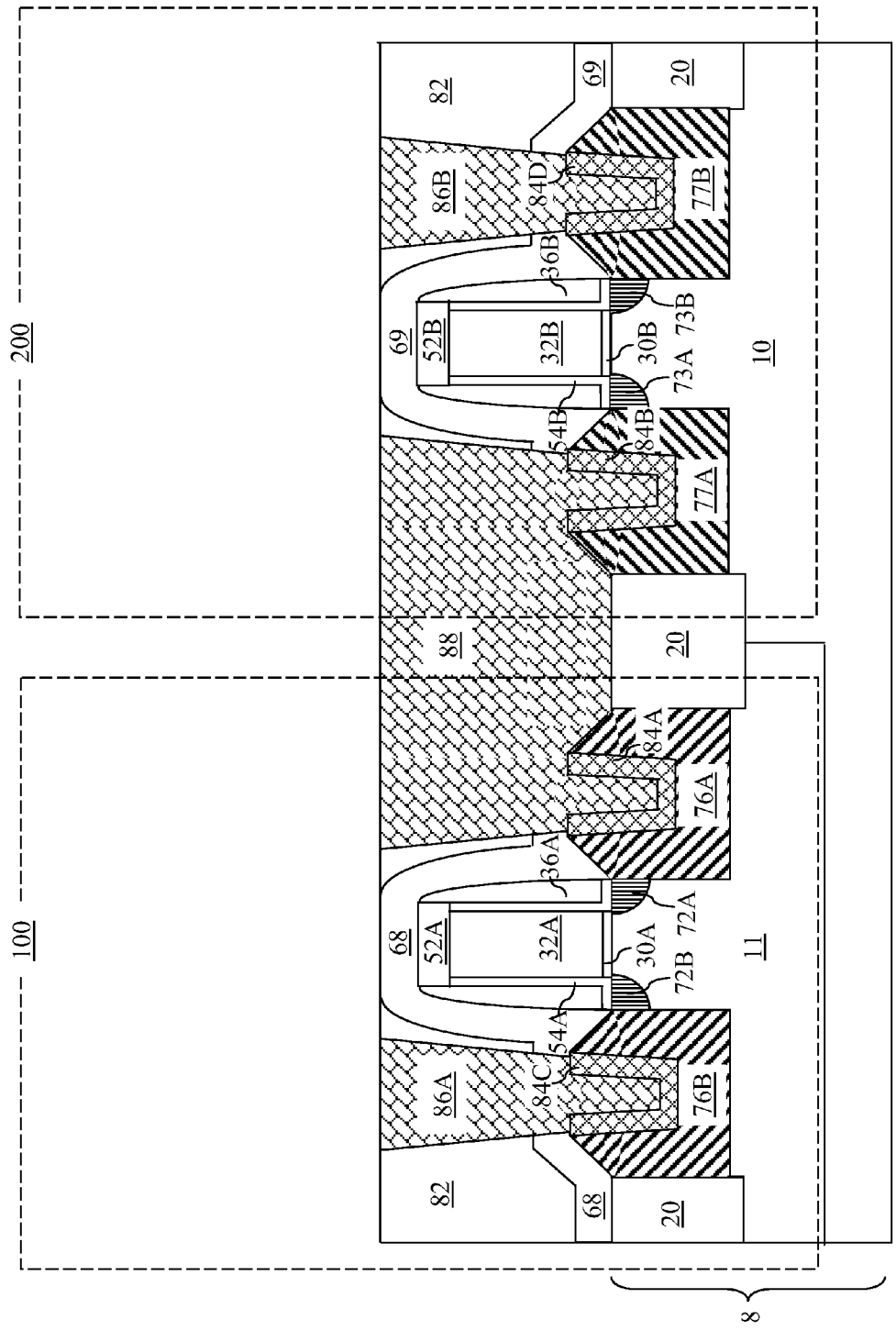
FIG. 18 is a vertical cross-sectional view of the exemplary semiconductor structure after formation of contact via structures.

Referring to FIG. 18, various contact via structures are formed by deposition of a conductive material into the trenches 83 and by filling the trenches 83 with the conductive material. The conductive material is typically a metal, which can be the same as, or different from the metal in the metal layer 78. (See FIG. 14.) Excess conductive material above the top surface of the contact level dielectric layer 82 is removed by planarization, which can be effected by, for example, chemical mechanical planarization, a recess etch, or a combination thereof. Remaining portions of the deposited conductive material form various contact via structures after the planarization. A topmost surface of each of the various contact via structures is coplanar with the topmost surface of the contact level dielectric layer 82.

The various contact via structures can include, for example, a first-type contact via structures that contact only one of the metal semiconductor alloy regions (84C, 84D). The first-type contact via structures include a first first-type contact via structure 86A that contacts the third metal semiconductor alloy region 84C and a second first-type contact via structure 86B that contacts the fourth metal semiconductor alloy region 84D. Each of the first-type contact via structures (86A, 86B) includes a lower contact via portion that is laterally surrounded by a metal semiconductor alloy region (84C, 84D) and an upper contact via portion that overlies a metal semiconductor alloy region (84C, 84D).

The various contact via structures can further include, for example, a second-type contact via structure 88 that contacts a plurality of metal semiconductor alloy regions (84A, 84B). The second-type contact via structure 88 includes a plurality of lower contact via portions and an upper contact via portion. Each of the lower contact via portions is laterally surrounded by a metal semiconductor alloy region (84A or 84B) and an upper contact via portion that overlies a plurality of metal semiconductor alloy region (84A and 84B). The shallow trench isolation structure 20 may the bottom surface of the second-type contact via structure 88.

For each metal semiconductor alloy region that underlies a first-type contact via structure (86A, 86B) or a second-type contact via structure 88, an upper metal semiconductor alloy portion of the metal semiconductor alloy region laterally surrounds a lower contact via portion of a contact via structure (86A, 86B, 88), and a lower metal semiconductor alloy portion of the metal semiconductor alloy region underlies the lower contact via portion of the contact via structure (86A, 86B, 88).

Because the trenches 83 are formed below a planar top surface of the semiconductor substrate 8 (See FIG. 13), each lower contact via portion of a contact via structure (86A, 86B, 88) extends below the planar top surface of the semiconductor substrate 8, which can be the coplanar with the bottom surfaces of the first and second gate dielectrics (30A, 30B). A lower metal semiconductor alloy portion of each metal semiconductor alloy region (84A, 84B, 84C, 84D) is located between the horizontal plane (that can includes the bottom surfaces of the first and second gate dielectrics (30A, 30B)), and a bottommost surface of the embedded first-semiconductor-material source/drain regions (76A, 76B) and the embedded second-semiconductor-material source/drain regions (77A, 77B), which are source regions and drain regions of field effect transistors.

At the bottommost portion of each upper portion of a contact via structure (86A, 86B, 88), a sidewall of the upper portion of the contact via structure (86A, 86B, 88) contacts the topmost portion of a metal semiconductor alloy region. The location at which the sidewall of the upper portion of the contact via structure (86A, 86B, 88) contacts the topmost portion of a metal semiconductor alloy region is laterally confined between an uppermost portion of an inner sidewall of the metal semiconductor alloy region (84A, 84B, 84C, 84D) and an uppermost portion of an outer sidewall of the metal semiconductor alloy region (84A, 84B, 84C, 84D) because the inner sidewall and the outer sidewall are laterally spaced by a constant distance. At the bottommost portion of each upper portion of a contact via structure (86A, 86B, 88), an entirety of a periphery of the upper contact via portion contacts an upper surface of the underlying metal semiconductor alloy region (84A, 84B, 84C, 84D).

Because the metal diffused into semiconductor material regions during formation of the various metal semiconductor alloy regions (84A, 84B, 84C, 84D), the outer sidewalls of the various metal semiconductor alloy regions (84A, 84B, 84C, 84D) expand outward compared with the original size of the trenches 83 as formed by etching. Thus, surfaces of the various metal semiconductor alloy regions (84A, 84B, 84C, 84D) contact the first or second stress-generating dielectric liners (68, 69), if present, or the contact level dielectric material layer 82 if first or second stress-generating dielectric liners are not present. The entirety of each upper contact via portion of the various contact via structures is embedded in the first and second stress-generating dielectric liners (68, 69) and the contact level dielectric material layer 82.

Figure 19:
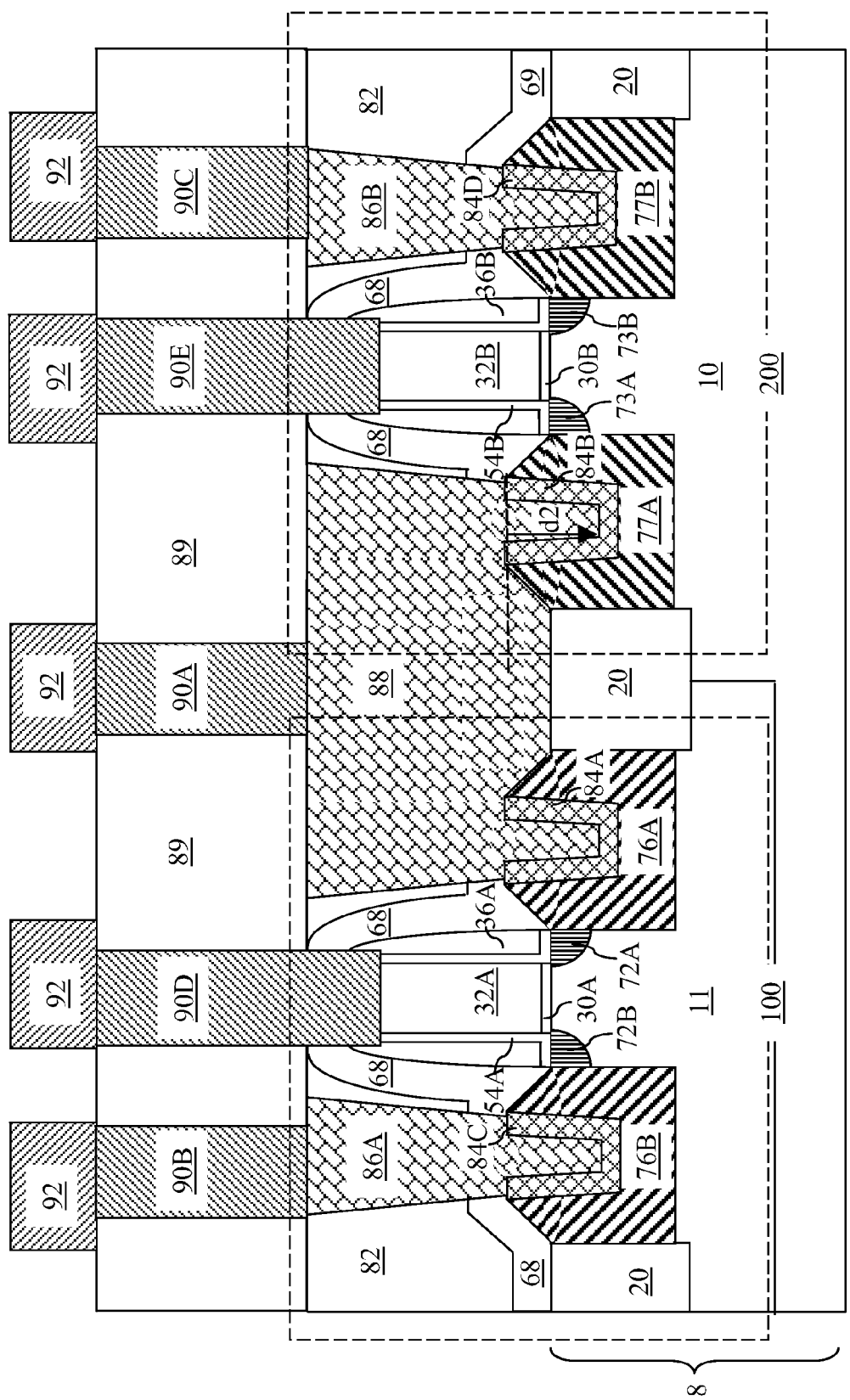
FIG. 19 is a vertical cross-sectional view of the exemplary semiconductor structure after formation of various upper level metal interconnect structures.

Referring to FIG. 19, various upper level metal interconnect structures can be subsequently formed. The upper level metal interconnect structures can include at least one interconnect level dielectric material layer 89, at least one conductive via structures (90A, 90B, 90C, 90D, 90E), and at least one conductive line structures 92.

Figure 20:
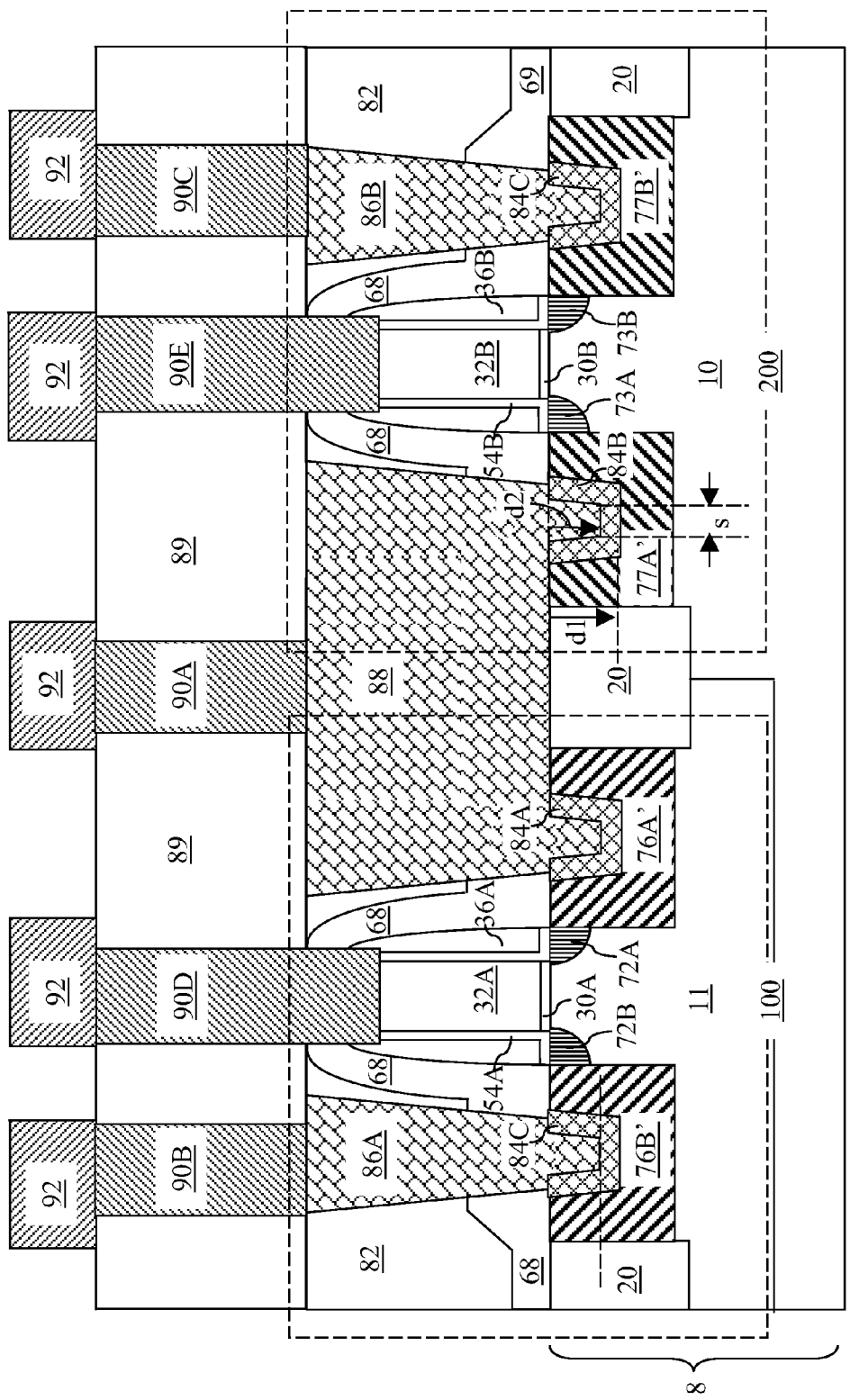
FIG. 20 is a vertical cross-sectional view of a first variation of the exemplary semiconductor structure.

Referring to FIG. 20, a first variation of the exemplary semiconductor structure can be derived from the exemplary structure by omitting formation of the first source/drain trenches 18 and the accompanying embedded first-semiconductor-material source/drain regions (76A, 76B) and/or by omitting formation of the second source/drain trenches 19 and the accompanying embedded second-semiconductor-material source/drain regions (77A, 77B). Instead, first implanted source/drain regions (76A', 76B') and/or second implanted source/drain regions (77A', 77B') are formed by employing masked ion implantation steps. Correspondingly, the top surfaces of the implanted source/drain regions (76A', 76B') and/or second implanted source/drain regions (77A', 77B') can be coplanar with the bottom surfaces of the first and second gate dielectrics (30A, 30B).

The bottommost surface of each metal semiconductor alloy region (84A, 84B, 84C, or 84D) can be at a first depth d1 from the topmost portions of the embedded first-semiconductor-material source/drain regions (76A, 76B) and the embedded second-semiconductor-material source/drain regions (77A, 77B). Within each upper metal semiconductor alloy portion, an inner sidewall and an outer sidewall of the upper metal semiconductor alloy portion are laterally spaced by a substantially constant width throughout. Each lower metal semiconductor alloy portion does not include a pair of an inner sidewall and an outer sidewall having a constant spacing therebetween.

If a metal semiconductor alloy region (84A, 84B, 84C, 84D) includes a horizontal bottom portion having a substantially constant thickness, the top surface of the horizontal portion can be at a second depth d2 from the topmost portion of the embedded first-semiconductor-material source/drain regions (76A, 76B) and the embedded second-semiconductor-material source/drain regions (77A, 77B). In this case, the boundary between the upper metal semiconductor alloy portion and the lower metal semiconductor alloy portion in any of the metal semiconductor alloy region (84A, 84B, 84C, or 84D) can be at the depth of the upper surface of the horizontal portion. The boundary between the upper metal semiconductor alloy portion and the lower metal semiconductor alloy portion within the third metal semiconductor alloy region 84C is represented by a horizontal dotted line. The lower metal semiconductor alloy portions of the metal semiconductor alloy regions (84A, 84B, 84C, or 84D) can be formed between a horizontal plane that includes the bottom surface of the gate dielectrics (30A, 30B) and a bottommost surface of the embedded first-semiconductor-material source/drain regions (76A, 76B) or the embedded second-semiconductor-material source/drain regions (77A, 77B). Inner sidewalls of a metal semiconductor alloy regions (84A, 84B, 84C, 84D) are laterally spaced at least by a spacing s throughout the entirety of the upper metal semiconductor alloy portion therein.

Figure 21:
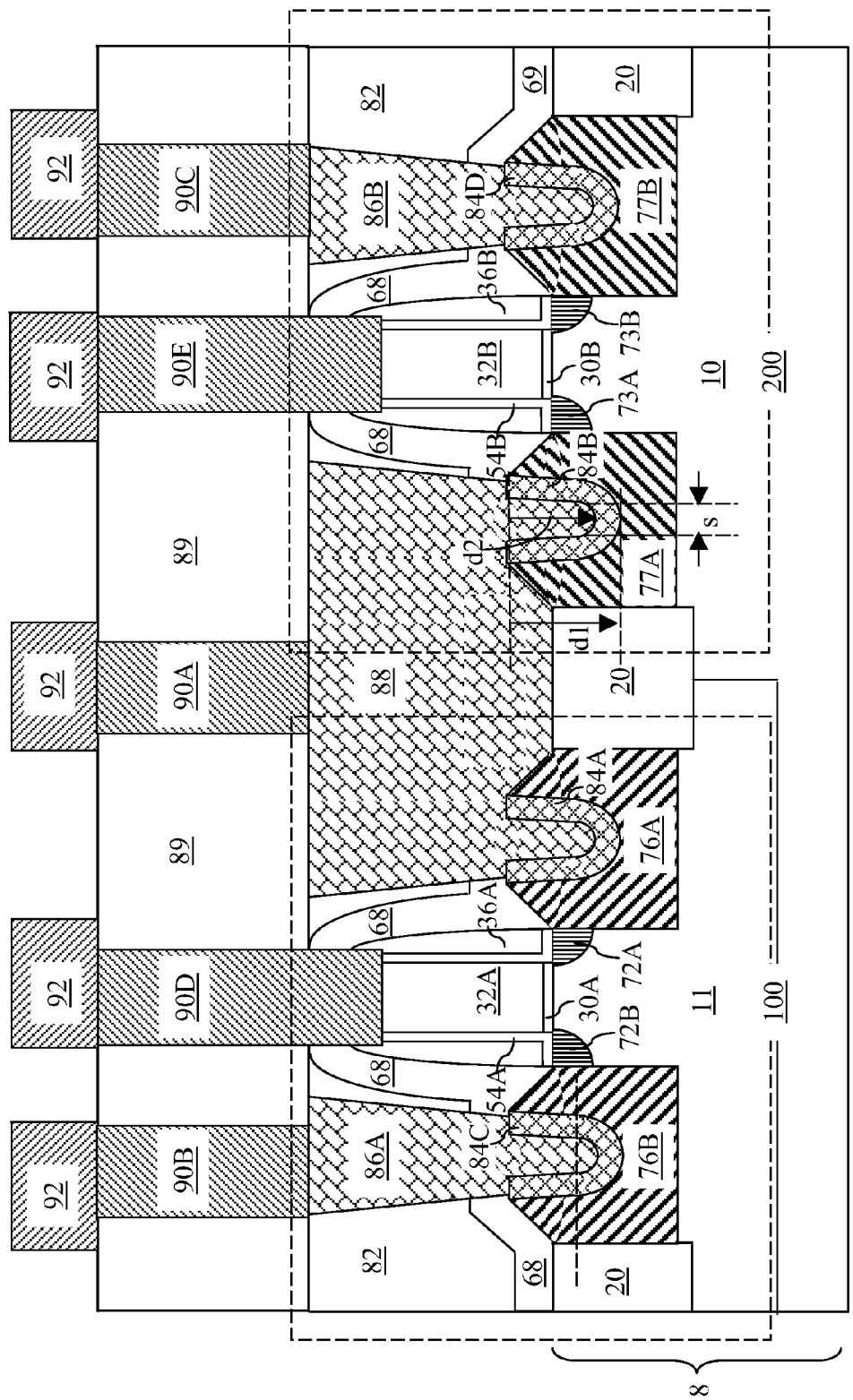
FIG. 21 is a vertical cross-sectional view of a second variation of the exemplary semiconductor structure.

Referring to FIG. 21, a second variation of the exemplary semiconductor structure can be derived from the first exemplary semiconductor structure or the first variation of the first exemplary semiconductor structure by employing an etch process that rounds the bottom surfaces of the trenches 83 at a processing step corresponding to FIG. 13. The bottommost surface of each metal semiconductor alloy region (84A, 84B, 84C, or 84D) can be at a first depth d1 from the topmost portions of the embedded first-semiconductor-material source/drain regions (76A, 76B) and the embedded second-semiconductor-material source/drain regions (77A, 77B). The boundary between the upper metal semiconductor alloy portion and the lower metal semiconductor alloy portion in any of the metal semiconductor alloy region (84A, 84B, 84C, or 84D) can be at a depth at which an inner sidewall and an outer sidewall of the metal semiconductor alloy region (84A, 84B, 84C, or 84D) becomes no longer parallel to each other. The boundary between the upper metal semiconductor alloy portion and the lower metal semiconductor alloy portion within the third metal semiconductor alloy region 84C is represented by a horizontal dotted line. Thus, the inner sidewalls of a metal semiconductor alloy regions (84A, 84B, 84C, 84D) are laterally spaced at least by a spacing s throughout the entirety of the upper metal semiconductor alloy portion therein.

The structure of the present disclosure can be implemented on any type of field effect transistors including conventional planar field effect transistors and finFETs, as well as bipolar transistors that require contacts to the emitter, base, and collector, and other semiconductor devices such as varactors, silicon controlled rectifiers, diodes, capacitors, resistors, and inductors that include at least one metal semiconductor alloy region.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
a trench located in a semiconductor material region in a semiconductor substrate;
a metal semiconductor alloy region located within said trench;
a contact via structure including a lower contact via portion that is located within said metal semiconductor alloy region and laterally spaced from said semiconductor material region by said metal semiconductor alloy region, said contact via structure directly contacts a surface of said semiconductor material region;
another trench located in another semiconductor material region in said semiconductor substrate; and
another metal semiconductor alloy region located within said another trench, wherein said contact via structure contiguously extends from a surface of said metal semiconductor alloy region to a surface of said another metal semiconductor alloy region.

2. The semiconductor structure of claim 1, wherein an entirety of said metal semiconductor alloy region is of integral construction and includes an upper metal semiconductor alloy portion and a lower metal semiconductor alloy portion, wherein said upper metal semiconductor alloy portion laterally surrounds said lower contact via portion and said lower metal semiconductor alloy portion underlies said lower contact via portion.

3. The semiconductor structure of claim 2, wherein an inner sidewall and an outer sidewall of said upper metal semiconductor alloy portion are laterally spaced by a substantially constant width throughout an entirety of a periphery of said lower contact via portion.

4. The semiconductor structure of claim 2, wherein said lower metal semiconductor alloy portion has a constant thickness between an upper horizontal surface of said lower metal semiconductor alloy portion and a lower horizontal surface of said lower metal semiconductor alloy portion.

5. The semiconductor structure of claim 1, wherein a sidewall of an upper portion of said contact via structure contacts said metal semiconductor alloy region between an uppermost portion of an inner sidewall of said metal semiconductor alloy region and an uppermost portion of an outer sidewall of said metal semiconductor alloy region.

6. The semiconductor structure of claim 1, further comprising at least one dielectric material layer overlying said semiconductor substrate, wherein an upper contact via portion of said contact via structure is embedded in said at least one dielectric material layer.

7. The semiconductor structure of claim 6, wherein said semiconductor material region and said metal semiconductor alloy region contact said at least one dielectric material layer.

8. The semiconductor structure of claim 6, wherein a topmost surface of said upper contact via portion is coplanar with a topmost surface of said at least one dielectric layer.

9. The semiconductor structure of claim 6, wherein an entirety of a periphery of said upper contact via portion contacts an upper surface of said metal semiconductor alloy region.

10. The semiconductor structure of claim 1, further comprising a shallow trench isolation structure directly contacting a bottom surface of said contact via structure.

11. The semiconductor structure of claim 1, wherein said lower contact via portion extends below a planar top surface of said semiconductor substrate.

12. The semiconductor structure of claim 11, wherein said planar top surface of said semiconductor substrate is substantially coplanar with an interface between a gate dielectric and a semiconductor portion within said semiconductor substrate.

13. The semiconductor structure of claim 1, wherein said semiconductor material region is a source region or a drain region of a field effect transistor.

14. The semiconductor structure of claim 13, wherein a lower metal semiconductor alloy portion of said metal semiconductor alloy region is located between a horizontal plane that includes a bottom surface of a gate dielectric and a bottommost surface of said source region or said drain region.

15. The semiconductor structure of claim 1, wherein said metal semiconductor alloy region does not directly contact said another metal semiconductor alloy region.

16. A semiconductor structure comprising:
a trench located in a semiconductor material region in a semiconductor substrate;
a metal semiconductor alloy region located within said trench;
a contact via structure including a lower contact via portion that is located within said metal semiconductor alloy region and laterally spaced from said semiconductor material region by said metal semiconductor alloy region, said contact via structure directly contacts a surface of said semiconductor material region;
another trench located in another semiconductor material region in said semiconductor substrate; and
another metal semiconductor alloy region located within said another trench, wherein said contact via structure directly contacts a surface of said semiconductor material region and a surface of said another semiconductor material region.

17. The semiconductor structure of claim 16, further comprising a shallow trench isolation region located between said semiconductor material region and said another semiconductor material region.

18. The semiconductor structure of claim 17, wherein said shallow trench isolation region directly contacts said semiconductor material region and said another semiconductor material region.

19. The semiconductor structure of claim 18, wherein said shallow trench isolation region directly contacts a bottom surface of said contact via structure.

* * * * *